US012566305B2

(12) United States Patent
Aggarwal et al.

(10) Patent No.: US 12,566,305 B2
(45) Date of Patent: Mar. 3, 2026

(54) PRESERVING ACCESS TO EDGE COUPLING COMPONENTS ON A WAFER PACKAGE

(71) Applicant: Celestial AI Inc., Santa Clara, CA (US)

(72) Inventors: Ankur Aggarwal, Pleasanton, CA (US); Anmol Rathi, San Jose, CA (US); Suresh Venkata Pothukuchi, Chandler, AZ (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 19/172,493

(22) Filed: Apr. 7, 2025

(65) Prior Publication Data

US 2025/0370199 A1      Dec. 4, 2025

Related U.S. Application Data

(60) Provisional application No. 63/694,684, filed on Sep. 13, 2024, provisional application No. 63/655,461, filed on Jun. 3, 2024.

(51) Int. Cl.
| | |
|---|---|
| *G02B 6/43* | (2006.01) |
| *G02B 6/42* | (2006.01) |
(Continued)

(52) U.S. Cl.
CPC ......... *G02B 6/4246* (2013.01); *G02B 6/4215* (2013.01); *G02B 6/4239* (2013.01); *G02B 6/4243* (2013.01); *G02B 6/4255* (2013.01); *G02B 6/4256* (2013.01); *G02B 6/43* (2013.01); *H01L 23/49816* (2013.01); *H01L 23/49827* (2013.01); *H01L 25/167* (2013.01); *H01L 25/50* (2013.01)

(58) Field of Classification Search
CPC ........................................................ G02B 6/43
USPC .......................................................... 385/14
See application file for complete search history.

(56) References Cited

U.S. PATENT DOCUMENTS

| | | | |
|---|---|---|---|
| 7,778,501 | B2 | 8/2010 | Beausoleil et al. |
| 7,889,996 | B2 | 2/2011 | Zheng et al. |
(Continued)

FOREIGN PATENT DOCUMENTS

| | | |
|---|---|---|
| CN | 106980160 A | 7/2017 |
| WO | WO2023177417 | 9/2022 |
(Continued)

OTHER PUBLICATIONS

U.S. Appl. No. 17/807,692, filed Jun. 17, 2022, Winterbottom et al.
(Continued)

*Primary Examiner* — Kaveh C Kianni
(74) *Attorney, Agent, or Firm* — Ray Quinney & Nebeker P.C.; James S. Bullough

(57) ABSTRACT

The present disclosure relates to packaging techniques in connection with packaging electrical and optical components within circuit packages. For example, one or more examples described herein involve techniques for packaging an electro-photonic circuit while preserving access to a grating coupler, which may involve using a sacrificial die and/or a sacrificial cap in conjunction with a unique over-molding process. Additional examples involve techniques for preserving access to an edge coupling structure.

23 Claims, 14 Drawing Sheets

(51) Int. Cl.

| | |
|---|---|
| *H01L 23/498* | (2006.01) |
| *H01L 25/00* | (2006.01) |
| *H01L 25/16* | (2023.01) |

(56) References Cited

U.S. PATENT DOCUMENTS

| | | | |
|---|---|---|---|
| 7,961,990 | B2 | 6/2011 | Krishnamoorthy et al. |
| 8,064,739 | B2 | 11/2011 | Binkert et al. |
| 8,237,278 | B2 | 8/2012 | Gluschenkov et al. |
| 9,495,295 | B1 | 11/2016 | Dutt et al. |
| 9,791,761 | B1 | 10/2017 | Li et al. |
| 9,831,360 | B2 | 11/2017 | Knights et al. |
| 10,168,475 | B2 * | 1/2019 | Parker ............... H01L 21/76251 |
| 10,852,492 | B1 * | 12/2020 | Vermeulen ............. G02B 6/423 |
| 10,962,728 | B2 | 3/2021 | Nelson et al. |
| 10,976,491 | B2 | 4/2021 | Coolbaugh et al. |
| 11,107,770 | B1 | 8/2021 | Ramalingam et al. |
| 11,222,867 | B1 | 1/2022 | Huang et al. |
| 11,233,580 | B2 | 1/2022 | Meade et al. |
| 11,336,376 | B1 | 5/2022 | Xie |
| 11,493,714 | B1 | 11/2022 | Mendoza et al. |
| 11,500,153 | B2 | 11/2022 | Meade et al. |
| 11,509,397 | B2 | 11/2022 | Ma et al. |
| 11,817,903 | B2 | 11/2023 | Pleros et al. |
| 11,837,509 | B1 * | 12/2023 | Chou .................... H10F 71/121 |
| 12,055,766 | B2 * | 8/2024 | Pupalaikis ........... G02B 6/3628 |
| 12,148,742 | B2 * | 11/2024 | Liljeberg ............... H04B 10/40 |
| 12,191,257 | B2 | 1/2025 | Aggarwal |
| 2011/0206379 | A1 | 8/2011 | Budd |
| 2015/0354938 | A1 | 12/2015 | Mower et al. |
| 2016/0116688 | A1 | 4/2016 | Hochberg et al. |
| 2017/0045697 | A1 | 2/2017 | Hochberg et al. |
| 2017/0115458 | A1 | 4/2017 | Mekis et al. |
| 2017/0194309 | A1 | 7/2017 | Evans et al. |
| 2017/0207600 | A1 | 7/2017 | Klamkin et al. |
| 2017/0237226 | A1 | 8/2017 | Johnson et al. |
| 2017/0261693 | A1 | 9/2017 | Gambino et al. |
| 2017/0261708 | A1 | 9/2017 | Ding et al. |
| 2019/0049665 | A1 | 2/2019 | Ma et al. |
| 2019/0067037 | A1 | 2/2019 | Pelletier et al. |
| 2019/0205737 | A1 | 7/2019 | Bleiweiss et al. |
| 2019/0265408 | A1 | 8/2019 | Ji et al. |
| 2019/0317285 | A1 | 10/2019 | Liff |
| 2019/0317287 | A1 | 10/2019 | Raghunathan et al. |
| 2020/0006304 | A1 | 1/2020 | Chang et al. |
| 2020/0142441 | A1 | 5/2020 | Bunandar et al. |
| 2020/0158967 | A1 | 5/2020 | Winzer et al. |
| 2020/0200987 | A1 | 6/2020 | Kim |
| 2020/0203309 | A1 | 6/2020 | Beyne |
| 2020/0250532 | A1 | 8/2020 | Shen et al. |
| 2020/0284981 | A1 | 9/2020 | Harris et al. |
| 2021/0064958 | A1 | 3/2021 | Lin et al. |
| 2021/0132309 | A1 | 5/2021 | Zhang et al. |
| 2021/0247569 | A1 * | 8/2021 | Traverso ............... G02B 6/4212 |
| 2021/0257396 | A1 | 8/2021 | Piggott et al. |
| 2021/0266200 | A1 | 8/2021 | Yang |
| 2021/0271020 | A1 | 9/2021 | Islam et al. |
| 2021/0286129 | A1 | 9/2021 | Fini et al. |
| 2022/0091332 | A1 | 3/2022 | Yoo et al. |
| 2022/0159860 | A1 | 5/2022 | Winzer et al. |
| 2022/0171142 | A1 | 6/2022 | Wright et al. |
| 2022/0328395 | A1 | 10/2022 | Chen et al. |
| 2022/0342150 | A1 | 10/2022 | Karhade et al. |
| 2022/0342164 | A1 | 10/2022 | Chen et al. |
| 2022/0374575 | A1 | 11/2022 | Ramey et al. |
| 2022/0382005 | A1 | 12/2022 | Rusu |
| 2023/0088009 | A1 * | 3/2023 | Karhade .............. G02B 6/4243 |
| | | | 385/14 |
| 2023/0197699 | A1 | 6/2023 | Spreitzer et al. |
| 2023/0258881 | A1 | 8/2023 | Weng et al. |
| 2023/0258886 | A1 | 8/2023 | Liao |
| 2023/0308188 | A1 | 9/2023 | Dorta-Quinones |
| 2023/0314702 | A1 | 10/2023 | Yu |
| 2023/0352464 | A1 * | 11/2023 | Damaraju ............... H01L 24/80 |
| 2023/0376818 | A1 | 11/2023 | Nowak |
| 2023/0393357 | A1 | 12/2023 | Ranno |
| 2023/0395443 | A1 | 12/2023 | Lai et al. |
| 2024/0030065 | A1 * | 1/2024 | Duan ................ H01L 21/76816 |
| 2024/0030147 | A1 * | 1/2024 | Duan .................... H01L 21/486 |
| 2024/0030204 | A1 * | 1/2024 | Duan .................... H01L 21/486 |
| 2024/0036254 | A1 * | 2/2024 | Winzer .............. G02B 6/12014 |
| 2024/0097796 | A1 * | 3/2024 | Winzer ............... H04B 10/503 |
| 2024/0272385 | A1 | 8/2024 | Chen et al. |
| 2025/0062258 | A1 * | 2/2025 | Kannan ............. H01L 23/49827 |
| 2025/0167187 | A1 * | 5/2025 | Yu ........................... H01L 24/08 |
| 2025/0201793 | A1 * | 6/2025 | Suthram ................. H01L 24/05 |
| 2025/0216629 | A1 * | 7/2025 | Psaila ................. G02B 6/4243 |

FOREIGN PATENT DOCUMENTS

| | | |
|---|---|---|
| WO | WO2022266676 | 12/2022 |
| WO | WO2023177922 | 9/2023 |

OTHER PUBLICATIONS

U.S. Appl. No. 18/293,673, filed Oct. 17, 2024, Bos et al.

Agrawal, Govind; "Chapter 4—Optical Receivers", Fiber-Optic Communications Systems, John Wiley & Sons, Inc., (2002), pp. 133-182.

Eltes, Felix et al.; "A BaTiO3-Based Electro-Optic Pockets Modulator Monolithically Integrated on an Advanced Silicon Photonics Platform"; J. Lightwave Technol. vol. 37, No. 5; (2019), pp. 1456-1462.

Eltes, Felix et al.; Low-Loss BaTiO3—Si Waveguides for Nonlinear Integrated Photonics'; ACS Photon., vol. 3, No. 9; (2016), pp. 1698-1703.

Harris, NC et al.; "Efficient, compact and low loss thermo-optic phase shifter in colicon"; Opt. Express, vol. 22, No. 9; (2014), pp. 10487-10493.

Hendry, G. et al.; "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12.

Miller, David A. et al.; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.

Raj, Mayank et al.; "Design of a 50-Gb/s Hybrid Integrated Si-Photonic Optical Link in 16-nm FinFET"; IEEE Journal of Solid-State Circuits, vol. 55, No. 4, Apr. 2020, pp. 1086-1095.

Zhang, Yulong; "Building blocks of a silicon photonic integrated wavelength division multiplexing transmitter for detector instrumentation" , Doktors Der Ingenieurwissenschaften (Dr.-Ing. ), Dec. 15, 2020 (Dec. 15, 2020), 128 pages.

"International Search Report and Written Opinion issued in PCT Application No. PCT/US2025/031959", Mail Date: Sep. 16, 2026, 17 pages.

* cited by examiner

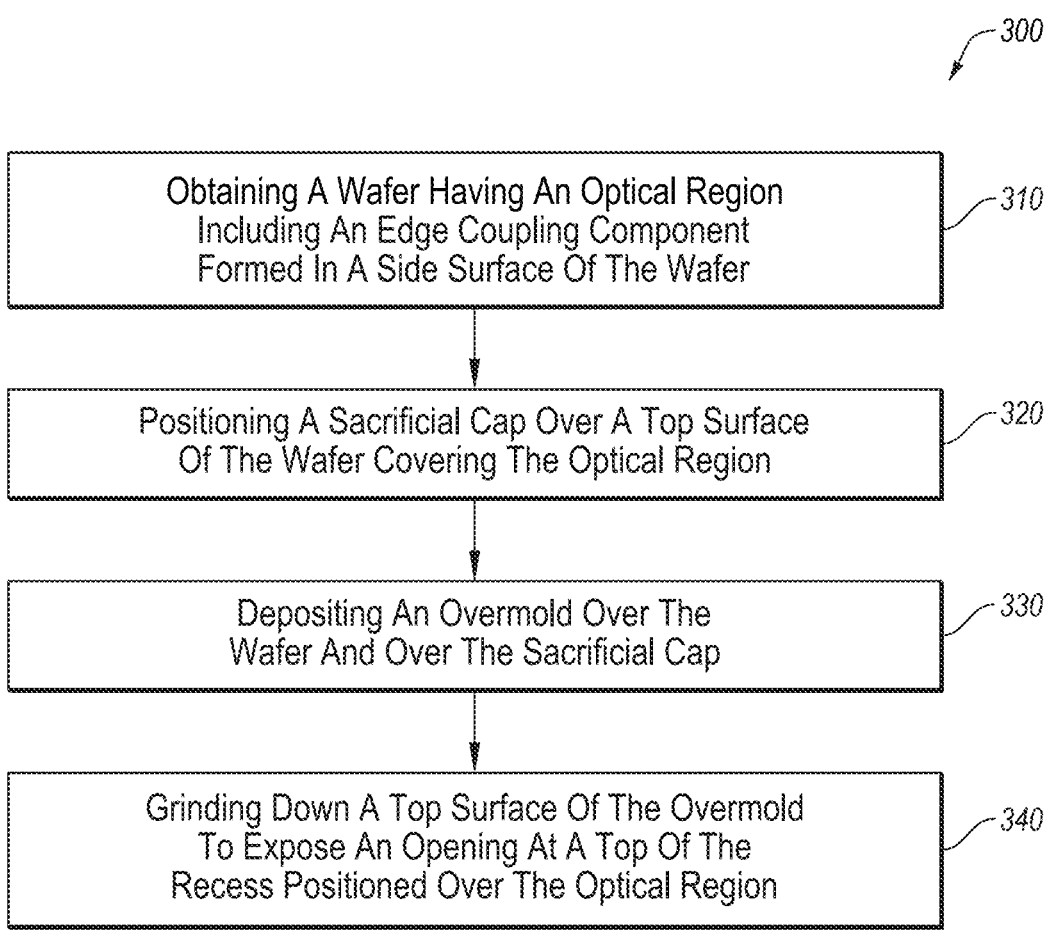

*300*

Obtaining A Wafer Having An Optical Region
Including An Edge Coupling Component
Formed In A Side Surface Of The Wafer    *310*

Positioning A Sacrificial Cap Over A Top Surface
Of The Wafer Covering The Optical Region    *320*

Depositing An Overmold Over The
Wafer And Over The Sacrificial Cap    *330*

Grinding Down A Top Surface Of The Overmold
To Expose An Opening At A Top Of The
Recess Positioned Over The Optical Region    *340*

FIG. 3A

PRESERVING ACCESS TO EDGE COUPLING COMPONENTS ON A WAFER PACKAGE

CROSS-REFERENCE TO RELATED APPLICATIONS

This application claims priority to U.S. Provisional Patent Application No. 63/655,461, entitled "PACKAGING OPTI-CALLY ACCESSIBLE COMPONENTS", filed on Jun. 3, 2024, the entirety of which is incorporated herein by refer-ence. This application also claims priority to U.S. Provi-sional Patent Application No. 63/694,684, entitled "PACK-AGING OPTICAL COMPONENTS," filed on Sep. 13, 2024, the entirety of which is incorporated herein by refer-ence.

BACKGROUND OF THE DISCLOSURE

The subject matter discussed in this section should not be assumed to be prior art merely as a result of inclusion in this section. Similarly, any problems mentioned in this section or associated with subject matter provided as background should not be construed as an admission of prior art.

Integrated circuits (ICs) with processors, especially those for executing artificial intelligence and machine learning functions, move large amounts of data among one or more processor ICs and one or more memory ICs. Chiplets may aid in the interconnection of processor dies, memory dies, and other circuits to increase the bandwidth and decrease latency and power dissipated in the process. In the event that these interconnections utilize optical elements, maintaining optical pathways through the hardware of a circuit package can become a challenge and present difficulties, particularly in manufacturing and implementing IC architectures.

BRIEF DESCRIPTION OF THE DRAWINGS

FIGS. 3A-3B illustrates flow diagrams for example meth-ods or series of acts for packaging an electro-photonic circuit as described herein, according to at least one embodi-ment of the present disclosure.

DETAILED DESCRIPTION

Figure 1:
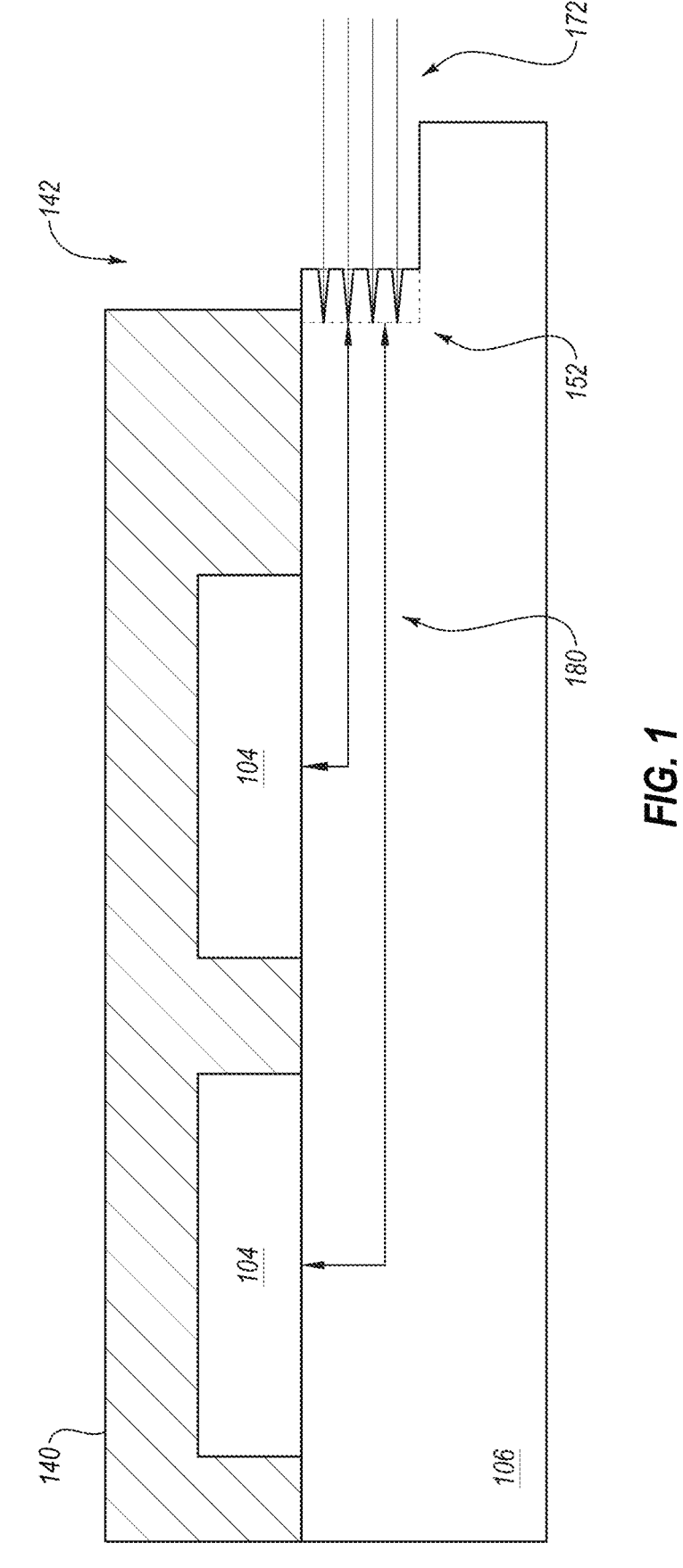
FIG. 1 illustrates a top view of a wafer having various components disposed thereon, according to at least one embodiment of the present disclosure.

The present disclosure relates to example implementa-tions of photonic circuit packages. Indeed, implementations herein relate to facilitating connectivity to optical interfaces by providing accessibility to such components at or through a surface of a molded circuit package. For instance, where a photonic circuit package may be covered or molded with an overmold—such as to maintain mechanical integrity of a substrate and/or to secure components thereto—the present techniques facilitate providing an optical window or void through the overmold for the purpose of providing a pho-tonic path to one or more photonic interphases disposed below a surface of the overmold. One or more particular examples described herein relate to providing an optical window through an overmold for access to an edge coupling region when producing a molded circuit package.

Photonic circuit packages, and more specifically electro-phonic circuit packages, can be used in an artificial intelli-gence (AI) accelerator, a bridge, a chiplet, or any other configuration that can benefit from photonic links on and off the package or within the package. For example, electro-photonic circuit packages may include electronic compo-nents, such as processing components, memory components and the like which operate in an electronic domain, as well as photonic components for communicating data via pho-tonic signals in a photonic domain.

One or more embodiments of the present disclosure relate to a circuit package (or wafer package) having features and functionality in accordance with one or more examples described and illustrated herein. For example, one or more embodiments described herein refer to a circuit package including a wafer having an optical region formed in a side surface of the wafer, the optical region being designed to allow one or more fibers to be coupled to waveguides that are formed within the wafer and accessible via one or more structures formed in the side surface of the wafer, the wafer further including a first portion of an electro-photonic trans-ceiver optically coupled to the optical region for sending and receiving light through the optical region in a lateral direc-tion via the fibers.

In one or more embodiments, the circuit package includes one or more electronic components having a plurality of second electrical connections on a bottom surface thereof, and being positioned on the top surface of the wafer such that there are electrical couplings between the plurality of first electrical connections and the plurality of second elec-trical connections, the one or more electronic components having a second portion of the electro-photonic transceiver connected to the first portion of the electro-photonic trans-ceiver via the electrical couplings. In one or more embodi-ments, the circuit package further includes an overmold layer including overmold deposited over a portion of the wafer and the one or more electronic components and a sidewall adjacent to the overmold on the top surface of the wafer positioned above the optical region and not extending over the side surface of the wafer, the sidewall and the overmold forming a structure that extends from the top of the optical region toward a top surface of the circuit pack-age.

In one or more embodiments, the optical window pro-vides lateral access to the side surface of the wafer whereby the one or more fibers may be coupled to the waveguides via the edge coupling component. In one or more embodiments, the edge coupling component (referred to, in some examples, as a side structure) is one or more v-grooves formed within the side surface of the wafer. In one or more embodiments, a material of the sidewall (referred to, in some examples, as a molding material) is made from a different material as the overmold. In one or more embodiments, a material of the sidewall is made from a same material as the overmold.

In one or more embodiments, the electro-optical transceiver includes a driver connected to a modulator in the first portion, a transimpedance amplifier (TIA) connected to a photodiode in the first portion, a serializer in the second portion that provides an output to the driver, and a deserializer in the second portion that receives an input from the TIA. In one or more embodiments, one or more of the driver and the TIA is in the first portion of the electro-optical transceiver. In one or more embodiments, the driver is selected from the group consisting of an electro-absorption modulator (EAM), a micro-ring resonator, a ring modulator, a Mach-Zender interferometer (MZI), and a quantum confined stark effect (QCSE) electro-absorptive modulator.

In one or more embodiments, the sidewall is a portion of a sacrificial cap placed over the optical region prior to grinding down the overmold layer, wherein placement of the sacrificial cap over the optical region prevents the overmold from flowing into an area around the side surface of the wafer. In one or more embodiments, the one or more electronic components include one or more of a processor component, a memory component, or an analog mixed signal (AMS) block.

In one or more embodiments, the wafer includes waveguides formed within the wafer and passing between the optical region and optical transmitter and receiver portions of the wafer. In one or more embodiments, the side surface is formed within one of an interior side surface formed within an outer perimeter of the wafer or an exterior side surface formed around the outer perimeter of the wafer.

As another example, in one or more embodiments, a circuit package includes a photonic integrated circuit (PIC) wafer. The PIC may include an optical region near a side surface of the PIC wafer, the optical region formed in the side surface of the PIC wafer, the optical region being designed to allow one or more fibers to be coupled to waveguides that are formed within the PIC wafer and accessible via structures on the side surface of the PIC wafer, the PIC wafer further including optical transmitter and receiver portions coupled to the optical region for sending and receiving light through the optical region in a lateral direction via the one or more fibers.

In addition to the PIC, the circuit package may include an electronic integrated circuit (EIC) layer. The EIC layer may include one or more electronic components disposed on the top surface of the PIC wafer (e.g., outside of the optical region) including electrical transmitter and receiver portions interconnected via the electrical interconnects with the optical transmitter and receiver portions forming electro-optical paths to and from the one or more electronic components to the optical region.

In one or more embodiments, the circuit package includes an overmold layer. The overmold layer may include overmold deposited over a portion of the PIC wafer and the one or more electronic components. The overmold layer may further include a sidewall on the top surface of the PIC wafer positioned above the optical region and not extending over the side surface of the PIC wafer, the sidewall and the overmold forming a structure that extends vertically from a top portion of the optical region to a top surface of the circuit package.

The circuit package including PIC may additionally include many similar features and characteristics as the first example circuit package described above. For example, in one or more embodiments, the optical window provides lateral access to the side surface of the PIC wafer such that the one or more fibers may be coupled to the waveguides via the structure(s) formed within the sidewall. In one or more embodiments, the structure(s) in the sidewall refer to v-groove(s) formed within the side surface of the PIC wafer. In one or more embodiments, a material of the sidewall (e.g., a molding material) is made from a different material as the overmold. In one or more embodiments, the material of the sidewall (e.g., the molding material) is made from a same material as the overmold.

In one or more embodiments, the circuit package includes a driver connected to a modulator in the PIC wafer, a transimpedance amplifier (TIA) connected to a photodiode in the PIC wafer, a serializer in the EIC layer that provides an output to the driver, and a deserializer in EIC layer that receives an input from the TIA. In one or more embodiments, one or more of the driver and the TIA is in the PIC wafer. In one or more embodiments, the driver is selected from the group consisting of an electro-absorption modulator (EAM), a micro-ring resonator, a ring modulator, a Mach-Zender interferometer (MZI), and a quantum confined stark effect (QCSE) electro-absorptive modulator.

In one or more embodiments, the sidewall is a portion of a sacrificial cap placed over the optical region prior to grinding down the overmold layer where placement of the sacrificial cap over the optical region prevents the overmold from flowing into an area around the side surface of the PIC wafer. In one or more embodiments, the one or more electronic components include one or more of a processor component, a memory component, or an analog mixed signal (AMS) block. In one or more embodiments, the PIC wafer includes waveguides formed within the PIC wafer and passing between the optical region and optical transmitter and receiver portions of the PIC wafer. In one or more embodiments, the side surface is formed within one or more of an interior side surface formed within an outer perimeter of the PIC wafer or an exterior side surface formed around the outer perimeter of the PIC wafer.

Additional features of the methods and devices described herein will be discussed in connection with example illustrations. For example, FIG. 1 illustrates an example of a circuit package 100 being configured for connecting to one or more external devices, according to at least one embodiment of the present disclosure. The circuit package 100 may include a substrate 106 having one or more dies 104 disposed thereon. The substrate 106 may be a photonic integrated circuit (PIC) or PIC wafer, and the dies 104 may be electronic integrated circuit (EIC) dies as described herein. More details regarding wafers, PICs, EICs, dies, the connection therebetween, and various features and functionalities thereof is shown and described below in connection with FIGS. 4A-6C.

In addition to the dies 104 being disposed on the substrate 106, an optical region 152 may be formed on or within the substrate 106. In the illustrated example, the optical region 152 may refer to a region within which an edge coupler or edge coupler region is included, and may be positioned at an edge of the substrate 106. The edge may be a physical edge of the substrate 106 (e.g., an exterior side surface at or near an edge of a substrate wafer), or may be a demarcation or boundary between the circuit package 100 and a next or neighboring circuit package on a larger wafer substrate (e.g., an interior side surface formed within an outer perimeter of a substrate wafer), for example, which may be cut or diced later in order to form a physical edge at the boundary. More information about optical regions, including edge coupler regions, is shown and described below in connection with additional examples and illustrate embodiments. In some cases, the optical region 152 is a region at the edge of the substrate 106 configured to allow light (e.g., photonic or optical signals) between photonic paths 180 formed at least partially in the substrate 106, and external optical fibers 172. For example, the optical region 152 may refer to or include an edge coupling component (e.g., v-grooves) formed in a side surface of the substrate 106 that allows one or more fibers to be coupled to waveguides that are formed within the substate 106 and which are accessible via an edge coupling component formed within the optical region 152. In one or more embodiments, the optical region 152 enables optical fibers to be coupled to the dies 104 by the photonic paths 180 (e.g., waveguides) for transmitting and receiving photonic signals through the photonic paths 180. In this way, the dies 104 may communicate photonically with external components by way of the photonic paths 180 that are coupled to external fibers 172 via edge coupling components within the optical region 152.

The circuit package 100 may be processed or manufactured to include an overmold 140 which may cover the various components exposed at the surface of the substrate 106 and may facilitate securing these components to the substrate 106. The resulting molded circuit package may include the substrate 106 and dies 104 covered and/or surrounded by the overmold 140, which may provide mechanical integrity for the molded circuit package and may maintain the dies 104 connected to the substrate, among other functions. Because the optical region is disposed or formed within the substrate 106, for instance, at or below a surface of the substrate 106, by disposing the overmold 140 on the substrate, the overmold 140 will often cover, obscure, or prevent access to the optical region 154. Thus, overmolding conventional circuit packages presents challenges associated with substrates having optical regions through which electronic components may be accessed.

The present disclosure describes various techniques for maintaining an optical window 142 (e.g., a physical path) or optical path through the overmold 140 such that the optical region 152 remains uncovered and optically accessible for coupling with the external optical fibers 172. In one or more embodiments described herein, the optical window 142 refers to a physical space that extends laterally and/or vertically from the optical region 152 (e.g., from the side surface of the substrate 108 where the optical region 152 is located)

As will be discussed in further detail below, various embodiments described herein relate to utilizing a sacrificial cap which can be disposed on the substrate 106 over the optical region 152 to prevent the overmold 140 from covering the optical region 152. Based on performing a grinding process to remove some of the overmold and a top portion of the sacrificial cap, a recess or void within the sacrificial cap can be exposed to reveal the optical window 142 therethrough, and ultimately, to expose the optical region 152 through the overmold 140. In this way, circuit packages including optical regoipons, and edge coupling components in particular, can be overmolded to created molded circuit packages while maintaining access and functionality of the optical connections formed within the substrate 108.

One conventional approach for overcoming challenges associated with overmolding PIC wafers (e.g., specifically with respect to edge couplers) is to form, dispose, uncover, or implement the edge coupling component after applying the overmold. For example, some techniques involve etching, grinding, or cutting away a portion of the overmold at or (e.g., directly) covering the edge coupler location in order to expose the (already formed) edge coupler or else to form the edge coupler in the PIC wafer. Such an approach can be costly, time-consuming, imprecise, complex, and unrefined.

Techniques for providing simple and direct access to optical regions (be they GCs, edge couplers, or others) within a substrate through an overmold can be advantageous and beneficial. Indeed, the present disclosure describes some example techniques for providing optical windows through overmolded circuit packages as part of a process for forming the overmolded circuit packages such that the optical fibers may be connected at edge couplers.

Additional detail will now be provided in connection with an example process in which a sacrificial cap is used in providing optical access to an optical region within a substrate of a circuit package. Indeed, as mentioned above, it can be desirable to maintain an optical path from an external location of the circuit package to an edge coupling component or edge coupler region of a circuit package (e.g., at the PIC) such that optical fibers or other components may be coupled or joined thereto to facilitate communication of optical signals between fibers and electronic components disposed on the substrate 108.

Figure 2A:
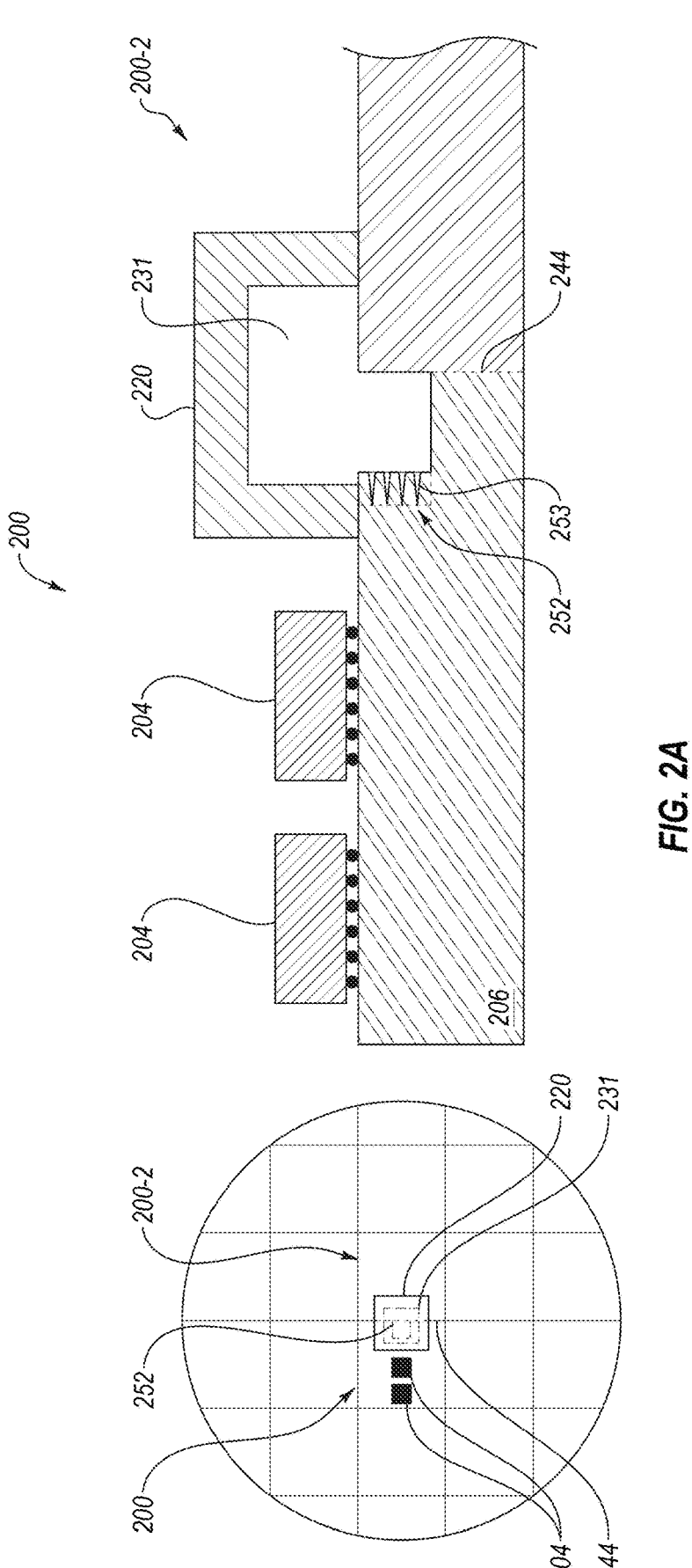
FIG. 2A illustrates an exemplary embodiment of a circuit package, according to at least one embodiment of the present disclosure.
Figure 2B:
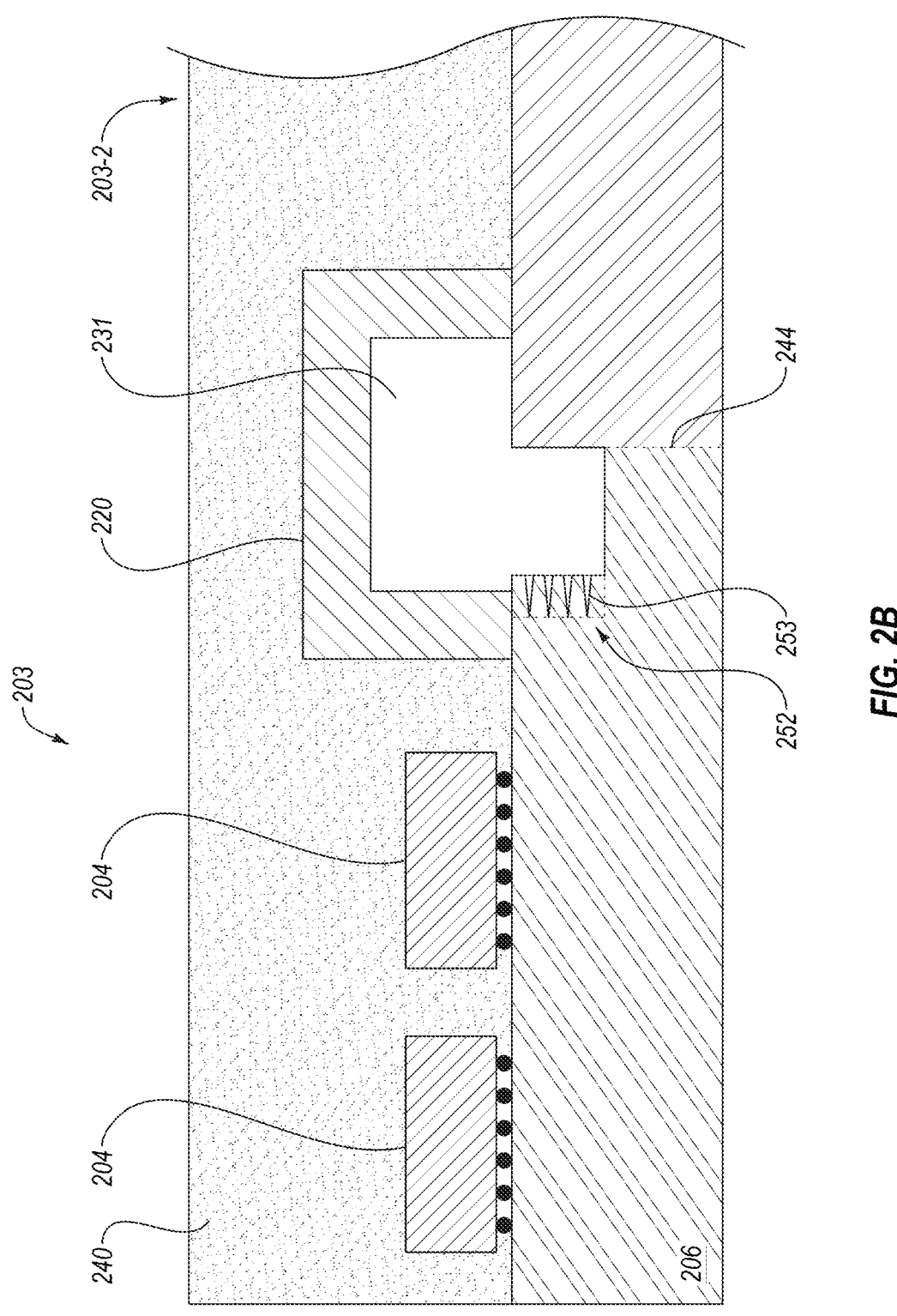
FIG. 2B illustrates side view of an exemplary embodi-ment of forming a molded circuit package, according to at least one embodiment of the present disclosure.

FIG. 2A illustrates a side view of a circuit package 200, and FIG. 2B illustrates a side view of an exemplary embodiment involving a next step of forming a molded circuit package 203, according to at least one embodiment of the present disclosure. The circuit package 200 may include any of the features and/or functionality of other circuit packages described herein. For instance, the circuit package 200 may include a PIC wafer 206 having one or more die components 204 disposed thereon, which may refer to one or more electronic components as described herein.

In some embodiments, the circuit package 200 includes an interface in a side surface of the PIC wafer 206 including an edge coupler region 252 formed at an edge 244 (e.g., an edge surface) of the PIC wafer 206. The edge 244 may be a physical edge or boundary of the PIC wafer 206, and may be formed based on dicing or cutting the PIC wafer 206 (e.g., and accordingly the circuit package 200) from a larger wafer package 201. As noted above, this edge 244 may be formed at a side surface of the PIC wafer 206 (e.g., around an external perimeter of a wafer having many individual chip packages disposed thereon). Alternatively, this edge 244 may be formed at a side surface of the PIC wafer 206 within an external perimeter of the PIC wafer 206 (between discrete packages or portions of the PIC wafer 206). It will be noted that while one or more embodiments described herein refer specifically to edges 244 and side surfaces that are formed within an interior portion of the PIC wafer 206, features and functionality described in connection with these "interior" side surfaces may nonetheless apply to any form of edge coupling in which an optical window is preserved to provide access to an optical region formed near or at a side surface of a PIC wafer (or other type of wafer or substrate).

In the example shown in FIG. 2A, the circuit package 200 may be created or disposed on the wafer package 201, with one or more other instance of (the same or different) circuit packages. Thus, in one or more embodiments, the edge 244 may represent a boundary between the circuit package 200, and a next or neighboring package 200-2 which is positioned adjacent on the wafer package 201. The edge 244 may be a physical edge or side surface after the circuit package 200 is diced and separated from the wafer package 201, but may also represent a demarcation between the circuit package 200 and the neighboring package 200-2 when both are disposed on the wafer package 201 and before dicing. The neighboring package 200-2 may be representative of a next or adjacent circuit package having one or more die components disposed thereon, or may be representative of a (e.g., empty) portion of the substrate of the wafer package 201 having no die components thereon, for example, when the circuit package 200 is a circuit package at a periphery (e.g., external perimeter) of the wafer package 201.

The edge coupler region 252 may be an area or region on the PIC wafer 206 which includes one or multiple edge coupling components or edge coupling features. For example, the edge coupler region 252 may typically include geometric features formed or cut out of the PIC wafer 206 such as one or more alignment features or V-grooves 253, similar to one or more embodiments described herein. For example, the V-grooves 253 may facilitate aligning one (and typically many) optical fibers with internal waveguides in the PIC wafer 206. The edge coupler region 252 may include other features and/or mechanisms whereby optical interface components may be coupled to or formed within the PIC wafer 206. In some cases, the edge coupler region 252 is formed in the PIC wafer 206 as part of a manufacturing process of the PIC wafer 206. For example, in some cases, the wafer package 201 is processed or operated on to form one or multiple edge coupler regions 252 in one or multiple circuit packages that are included on the wafer package 201.

In some embodiments, a sacrificial cap 220 is disposed on the PIC wafer 206 at a location corresponding to the edge coupler region 252. For example, the sacrificial cap 220 may be a component or structure which includes or defines a void or recess 231 within an inner portion of the sacrificial cap 220. The recess 231 may be a cutout or a vacant portion of the sacrificial cap 220 which is positioned at or facing a bottom surface of the sacrificial cap 220. For instance, when the sacrificial cap 220 is placed on the PIC wafer 206, the recess 231 is disposed toward the PIC wafer 206. While shown in two-dimensions and as a tunnel through the sacrificial cap 220, it will be appreciated that the recess 231 may be a void entirely within a body of the sacrificial cap 220 such that the sacrificial cap 220 is continuous around a perimeter of the recess 231 with a bottom surface of the volume of the recess 231 being exposed at the bottom of the sacrificial cap 220. Thus, the recess 231 may not necessarily be a void through the sacrificial cap 220, but rather, a void disposed within the sacrificial cap 220. It will also be appreciated that the sacrificial cap 220 may have a variety of geometric shapes and dimensions. In some example, the sacrificial cap 220 defines a circular shaped void, a rectangular shaped void, or other polygonal shaped void that forms a protective void or recess over the edge coupler region 252 when placed over a top surface of the PIC wafer 206.

As shown, the sacrificial cap 220 may be disposed on the PIC wafer 206 at the edge 244 and over the edge coupler region 252. For instance, the sacrificial cap 220 may be disposed partly on the circuit package 200 and partly on the neighboring package 200-2, or otherwise straddling or spanning the edge 244 between these two packages. The sacrificial cap 220 may be bonded, glued or adhered to the PIC wafer 206 and/or the neighboring wafer 206-2. For example, an adhesive layer may be applied and/or positioned between the sacrificial cap 220 and the wafers of these circuit packages. In some cases, the adhesive layer is deposited on the sacrificial cap 220, or else the adhesive layer may be deposited on the wafer(s). The adhesive layer may be positioned around or surrounding the edge coupler region 252 such that the edge coupler region 252 is contained within an enclosed area defined by the adhesive layer. For instance, the adhesive layer may be positioned entirely around a perimeter of the edge coupler region 252.

In this way, the sacrificial cap 220 may be adhered to the PIC wafer 206 in a surrounding configuration around a periphery of the edge coupler region 252. For instance, the edge coupler region 252 may be entirely contained or covered by the sacrificial cap 220, for example, in the recess 231. The sacrificial cap 220 may be disposed on and bonded to the PIC wafer 206 and neighboring wafer 206-2 in conjunction with, before, or after placement of one or more other die components 204 on the PIC wafer 206. As mentioned, the die components 204 may be electronic components such as processing components, memory components, and other electronic components as described herein.

While the sacrificial cap 220 is shown specifically at a singular edge 244 of the circuit package 200, it will be appreciated that any number of the edges of the circuit package 200 (e.g., edges between the circuit package 200 and adjacent circuit packages on the wafer package 201) may include edge coupler regions 252, and accordingly, sacrificial caps 220 may be positioned at any of these edges in accordance with the techniques described herein.

As shown in FIG. 2B, a molding compound may be applied or disposed on the PIC wafer 206 and the components disposed thereon to create an overmold 240. The overmold 240 may be applied over a top surface of the PIC wafer 206, sacrificial cap 220, and die components 204. In one or more embodiments, the overmold 240 may be applied over multiple circuit packages of the wafer package 201 as part of a single overmold application process. For instance, the wafer package 201, and all components disposed thereon, may be covered by the overmold 240 such that the wafer package 201 is a molded wafer package. Accordingly, the overmold 240 may be continuous between the circuit package 200 and the neighboring package 200-2. In this way, a molded circuit package 203 and a neighboring molded package 203-2 are created by applying the overmold 240, which molded circuit packages area joined until separated by dicing.

The overmold 240 may be made from a variety of materials having various properties. For example, in one or more embodiments, the overmold 240 is an epoxy molding compound in a liquid form that hardens and/or cures to secure elements of a circuit package in place when deposited over a surface of the circuit package. The overmold 240 covers each of the components positioned on the PIC wafer 206 and fills in gaps between (and in some cases underneath) the components to cover any exposed and/or vacant areas of the circuit packages. In this way the molded circuit packages 203 and 203-2 may be created by applying the overmold 240 to the PIC wafer 206.

The sacrificial cap 220 may be bonded to the PIC wafer 206 such that the overmold 240 does not flow underneath the sacrificial cap 220 and into a void or recess formed within a body of the sacrificial cap 220 positioned over an optical region (e.g., the edge coupler region 252) of the PIC wafer 206. Accordingly, because the sacrificial cap 220 has the recess 231 therein, and because the recess 231 is positioned over the edge coupler region 252, a vacant space may be maintained above the edge coupler region 252 by the sacrificial cap 220 where the overmold 240 does not enter. In other words, the overmold 240 may be prevented from coming into contact with, and does not directly cover, the edge coupler region 252 due to the sacrificial cap 220 and associated recess 231 formed therein. For example, the recess 231 may be sized and shaped in accordance with the edge coupler region 252 which it is positioned to cover. For example, a cross section or projection of the recess 231 onto the edge coupler region 252 may be approximately the same shape and/or size as the edge coupler region 252. In some cases, the recess 231 may be slightly larger than the edge coupler region 252. As will be discussed below, maintaining this space above the edge coupler region 252 facilitates creating an optical window through the overmold 240 in connection with a grinding process and/or a dicing process, for providing access to the edge coupler region 252.

In one or more embodiments, the sacrificial cap 220 is made of a similar type of material as the overmold 240. For example, the sacrificial cap 220 may be made of the same molding compound as the overmold 240. Alternatively, the sacrificial cap 220 may be made from a different material or molding compound as the overmold 240. For instance, the material of the sacrificial cap 220 may be made from a molding material that expands or compresses at a different rate as the material of the overmold 240 to prevent the overmold from becoming damaged during one or more manufacturing steps of the resulting circuit package.

In one or more embodiments, the sacrificial cap 220 is pre-made using a molding compound (e.g., epoxy) that is placed into a die, mold, or template structure that, when hardened, produces the sacrificial cap 220 having the structure shown and described. In some cases, multiple sacrificial caps 220 are created at once from a mold or die having multiple instances of the sacrificial cap 220. The sacrificial cap 220 may be made of any suitable material, such as plastics and polymers, metals, substrate material (e.g., silicon), or any other material for creating a sacrificial cap to achieve the purposes described herein.

The dimensions of the recess 231 above the edge coupler region 252 of the PIC wafer 206 may be specifically determined in accordance with a grinding process to be performed on the molded circuit package 203. For example, in some cases, the recess 231 extends approximately the same height as the one or more die components 204 disposed on the PIC wafer 206, or may extend further or thicker than the die components 204. In the least, the recess 231 is thick or tall enough such that an opening to the recess 231 is exposed after a grinding process has been performed and an optical window that provides physical access to the edge coupling component(s) via the optical region. For example, the sacrificial cap 220 may be sized, shaped, and configured in accordance with a griding process to be performed such that a top portion of the sacrificial cap 220 is removed during the grinding process, exposing the recess 231 underneath.

In some cases, the sacrificial cap 220 has a height or thickness of 500 to 1000 microns thick, and the recess 231 extends to within 50-100 microns of the top surface of the sacrificial cap 220. In some cases, the recess 231 extends to within 25-75 microns of the top surface of the sacrificial cap 220. As an example, the sacrificial cap 220 may be 500 microns thick, and the recess 231 may extend 400-450 microns from the bottom of the sacrificial cap 220. In some cases, the sacrificial cap maybe 800 microns thick, and the recess 231 may extend 700-750 microns from the bottom surface. As another example, the sacrificial cap 220 may be 1000 microns thick and the recess 231 may extend 900-950 microns from the bottom surface.

In some cases, rather than having an entirely empty or vacant recess 231, one or more fill components may be positioned in the recess 231, completely or partially filling the recess 231. For example, the fill components may be non-functional or space-filling components positioned (e.g., loose, or temporality connected) in the recess 231. When the recess 231 is exposed from the later grinding process, the fill components may be removed to expose the edge coupler region 252. The fill components in this way may facilitate taking up space within the recess 231 such that thermal expansion and/or contraction of gasses (e.g., air) within the recess 231 does not damage the sacrificial cap 220 or a bond of the sacrificial cap 220 to the PIC wafer 206. For instance, the circuit package 200 may be exposed to elevated temperatures at one or more stages, and trapped gasses in the recess 231 may tend to thermally expand. In some cases, the fill components may be made of a material which experiences thermal contraction/expansion to a lesser degree, or not at all. In this way, the sacrificial cap 220 may be filled with less gas, which may in turn exhibit less overall thermal expansion, mitigating the risks of damaging the sacrificial cap 220, and subsequently damaging or causing the circuit package to suffer in performance.

In some embodiments, the sacrificial cap 220 is equipped with one or more holes or openings such that trapped gas may vent or escape under thermal expansion. For instance, these holes or openings may be small enough that the overmold 240 (e.g., in its liquid state) does not penetrate or flow into the recess 231 due to a viscosity of the (liquid) molding compound. In another example, the sacrificial cap 220 is equipped with a chimney-like structure which may extend upwards past the upper extent of the overmold 240 such that trapped gas may escape the recess 231 while preventing the molding compound from flowing into the recess 231.

Figure 2C:
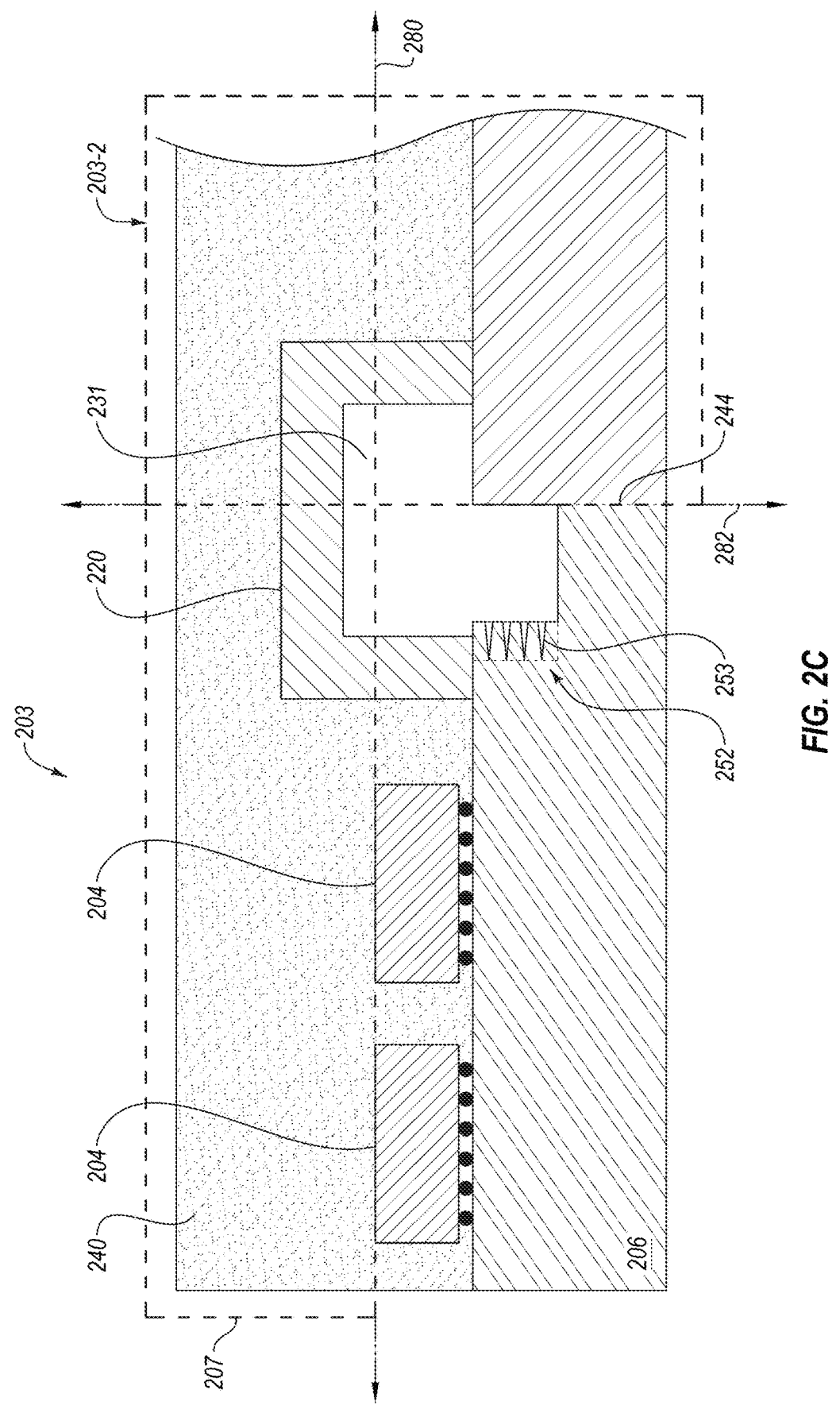
FIGS. 2C and 2D illustrate example grinding and dicing processes of molded circuit packages, according to at least one embodiment of the present disclosure.
Figure 2D:
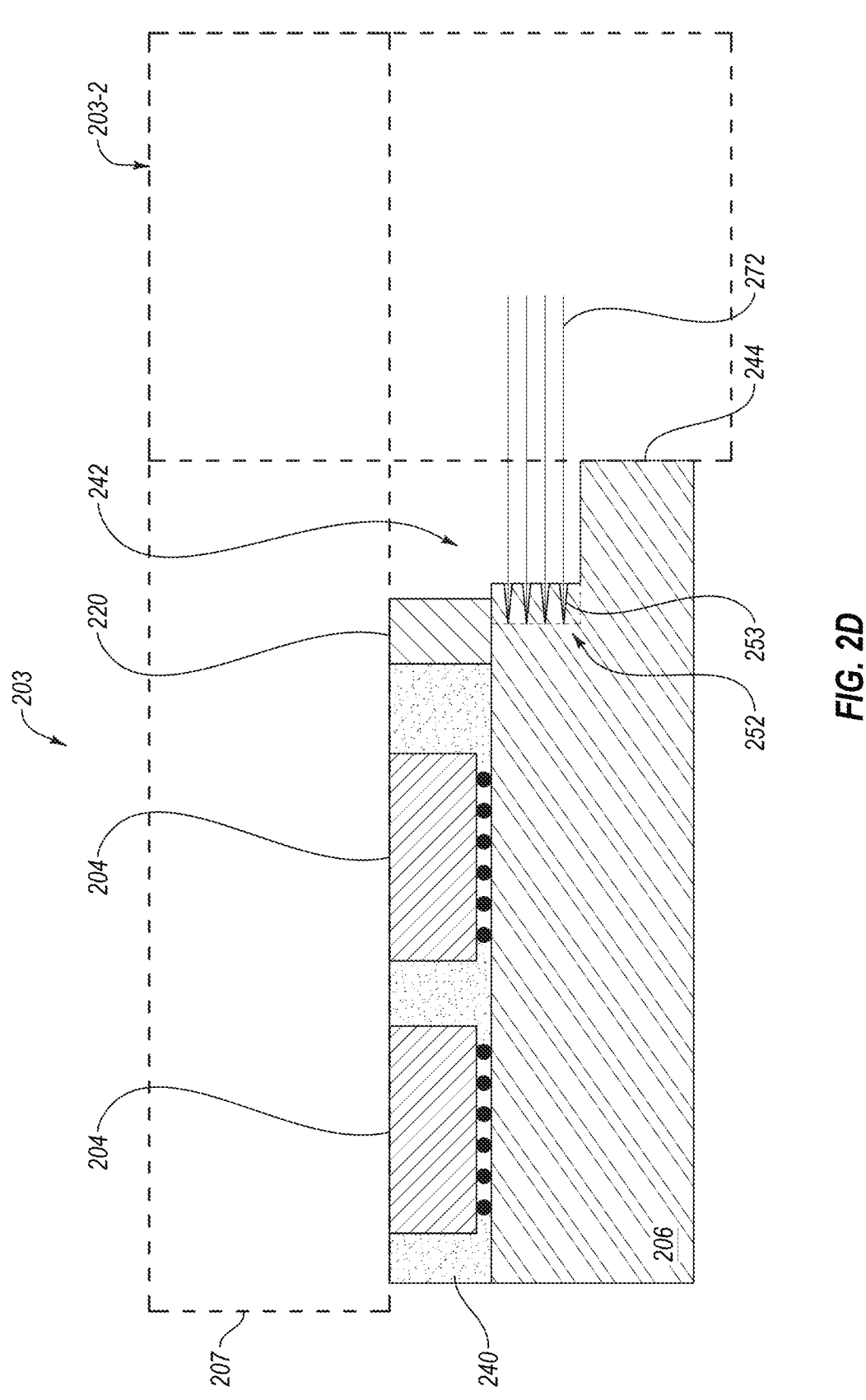

FIGS. 2C and 2D illustrate example grinding and dicing processes of the molded circuit packages 203 and 203-2, according to at least one embodiment of the present disclosure. In some embodiments, after the overmold 240 has dried, cured, and/or hardened, one or more layers of overmold 240 may be removed. For instance, as shown in FIG. 2C, the molded circuit package 203 may be processed to perform a grinding process 280, which may remove a layer 207 of the molded circuit package 203. For instance, the layer 207 may be grinded, milled, etched, or otherwise removed from the molded circuit package 203. In some cases, the layer 207 may include a portion of the overmold 240. In some cases, a portion of the sacrificial cap 220 is removed in the layer 207 as part of the grinding process 280. For instance, a top portion of the sacrificial cap 220 may correspond with the layer 207 and may be removed by the grinding process 280.

In particular, the grinding process 280 may be implemented in connection with the dimensions and/or geometry of the sacrificial cap 220, and more specifically, the dimensions and/or geometry of the recess 231. For example, the grinding process 280 may be such that it removes the layer 207 at a thickness corresponding with an entirety (or more) of the top portion being removed from the sacrificial cap 220. Accordingly, the sacrificial cap 220 may be sized and configured in accordance with the grinding process 280, based on the various components (e.g., the electronic components) disposed on the PIC wafer 206. For instance, the sacrificial cap 220 may extend from the PIC wafer 206 a greater distance than a thickness of any electronic components or dies positioned on the PIC wafer 206. This may facilitate the recess 231 extending past the thickness of any components disposed on the PIC wafer 206 such that the grinding process 280 may be performed to remove the top portion of the sacrificial cap 220 down to the recess 231, for example, without contacting or reaching other components disposed on the PIC wafer 206.

As shown, after the grinding process 280 and after the layer 207 (including the top portion) are removed, an optical window 342 is now available that provides direct access to the edge coupler region 252 on the PIC wafer 206. For instance, the optical window 342 may extend and/or provide access through the overmold 240, such that the edge coupler region 252 may be directly accessible (e.g., from above) through the overmold 240. For example, the optical window 342 (e.g., corresponding with a dimension of the recess 231) may span substantially all of the edge coupler region 252.

In addition to the grinding process 280, a dicing process 282 may be performed which may dice, cut, or separate the molded circuit packages 203 and 203-2 at the edge 244. For instance, the dicing process 282 may separate, dice, or cut a portion of the sacrificial cap 220 which, as described above, straddles or spans the edge 244. Thus, in addition to being grinded to remove a top portion of the sacrificial cap 220, the sacrificial cap 220 may further be separated (e.g., vertically) between the molded circuit packages 203 and 203-2 via the dicing process 282. For example, a portion of the sacrificial cap 220 may remain on the molded circuit package 203 connected to the PIC wafer 206 and/or embedded in the overmold 240, and another portion of the sacrificial cap 220 may remain on the neighboring molded package 203-2 after the dicing process 282.

The dicing process 282 may create or expose the edge 244 such that the edge coupler region 252 is positioned at the edge, end, or periphery of the molded circuit package 203. For example, not only does the optical window 342 provide access from above to the edge coupler region 252, but the optical window 342 in conjunction with the diced edge 244 provides vertical or side access to the edge coupler region 252. As shown in FIG. 2D, one or more optical fibers 272 or other optical interface components may be coupled (e.g., horizontally) to the edge coupling features and mechanisms of the edge coupler region 252, such as coupling to the V-grooves 253. In this way, one or more electronic components of the molded circuit package 203 may communicate with one or more external or off-chip devices through photonic signals via the optical interface formed at the edge coupler region 252.

Figure 3B:
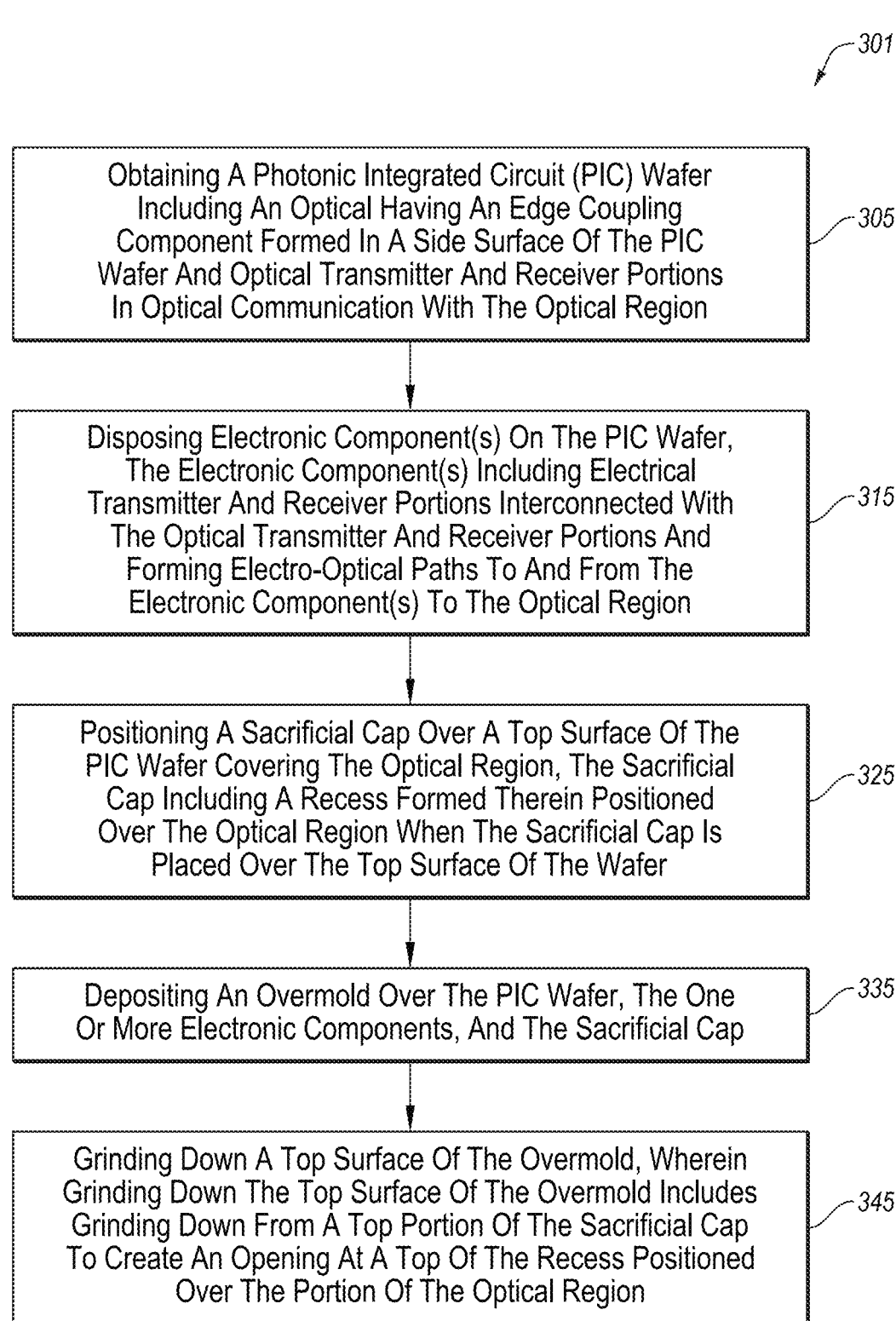

FIGS. 3A-3B illustrate flow diagrams for example series of acts related to packaging an electro-photonic circuit as described herein, according to at least one embodiment of the present disclosure. While FIGS. 3A-3B illustrate acts according to one or more embodiment, alternative embodiments may add to, omit, reorder, or modify any of the acts shown in FIGS. 3A-3B.

As just mentioned, FIG. 3A illustrates an example series of acts 300 related to packaging an electro-photonic circuit having a side-coupling component formed therein. As shown in FIG. 3A, the series of acts 300 includes an act 310 of obtaining a wafer having an optical region including an edge coupling component formed in a side surface of the wafer. In one or more embodiments, the act 310 includes obtaining a wafer having an optical region formed in a side surface of the wafer, the optical region being designed to allow one or more fibers to be coupled to waveguides that are formed within the wafer and accessible via one or more structures formed in the side surface of the wafer.

As further shown in FIG. 3A, the series of acts 300 includes an act 320 of positioning a sacrificial cap over a top surface of the wafer covering the optical region. In one or more embodiments, the act 320 includes positioning a sacrificial cap over a top surface of the wafer covering the optical region, wherein the sacrificial cap includes a recess formed therein, and where the recess is positioned over a portion of the optical region when the sacrificial cap is placed over the top surface of the wafer.

As further shown in FIG. 3A, the series of acts 300 includes an act 330 of depositing an overmold over the wafer and over the sacrificial cap. As further shown, the series of acts 300 includes an act 340 of grinding down a top surface of the overmold to expose an opening at a top of the recess positioned over the optical region. In one or more embodiments, the act 340 includes grinding down a top surface of the overmold, wherein grinding down the top surface of the overmold includes grinding down from a top portion of the sacrificial cap to expose an opening at a top of the recess positioned over the portion of the optical region.

In one or more embodiments, the series of acts 300 includes an act of coupling the one or more fibers to the waveguides formed within the wafer via the one or more structures formed in the side surface of the wafer. In one or more embodiments, the one or more structures are v-grooves formed within the side surface of the wafer. In one or more embodiments, the waveguides couple components of the electro-photonic circuit with one or more additional components off-chip from the electro-photonic circuit.

In one or more embodiments, the series of acts 300 includes an act of, prior to depositing the overmold over the top surface of the wafer, disposing one or more electronic components on the top surface of the wafer, where disposing the one or more electronic components over the top surface of the wafer comprises connecting electrical contacts on the one or more electronic components to bumps on the top surface of the wafer and forming electro-optical paths to and from the one or more electronic components to the optical region via waveguides formed within the wafer. In one or more embodiments, the one or more electronic components include one or more of a processor component, a memory component, or an analog mixed signal (AMS) block.

In one or more embodiments, prior to grinding down the top surface of the overmold, the top portion of the sacrificial cap extends over a top of the recess, and the top portion of the sacrificial cap has a thickness of greater than 25 microns. In one or more embodiments, a thickness between a top and bottom surface of the sacrificial cap prior to grinding down the top surface of the overmold is less than 1000 microns.

In one or more embodiments, the overmold does not flow between the sacrificial cap and the wafer. In one or more embodiments, the sacrificial cap is made from a same material as a material of the overmold that is deposited over the wafer. In one or more embodiments, the sacrificial cap is made from a different material as a material of the overmold that is deposited over the wafer.

In one or more embodiments, the wafer includes a first package portion and a second package portion adjacent to the first package portion, the first package portion having the one or more electronic components deposited thereon, the edge region being formed in a region between the first package portion and the second package portion. In one or more embodiments, the series of acts 300 includes an act of dicing vertically between a top surface and a bottom surface of the wafer and through a portion of the recess, wherein dicing vertically between the top surface and the bottom surface of the wafer through the portion of the recess provides lateral access to the side surface of the wafer having the edge coupling component formed therein. In one or more embodiments, the series of acts 300 includes an act of coupling the one or more fibers to the waveguides via the laterally accessible side surface, where coupling the one or more fibers to the waveguides causes the one or more fibers to be optically coupled to the one or more electronic components via the waveguides formed within the wafer.

In one or more embodiments, the side surface is formed within an interior side surface formed within an outer perimeter of the wafer. In one or more embodiments, the side surface is formed within an exterior side surface formed around the outer perimeter of the wafer.

As mentioned above, FIG. 3B illustrates an example series of acts 301 related to packaging an electro-photonic circuit having a side coupling component implemented therein. As shown in FIG. 3B, the series of acts 301 includes an act 305 of obtaining a photonic integrated circuit (PIC) wafer including an optical region having an edge coupling component formed in a side surface of the PIC wafer and optical transmitter and receiver portions in optical communication with the optical region. In one or more embodiments, the act 305 includes obtaining a photonic integrated circuit (PIC) wafer including an optical region formed in a side surface of the PIC wafer, the optical region being designed to allow one or more fibers to be coupled to waveguides that are formed within the PIC wafer and accessible via one or more structures formed in the side surface of the PIC wafer. The PIC wafer may further include optical transmitter and receiver portions in optical communication with the optical region, the optical transmitter and receiver portions having electrical interconnects to the top surface of the PIC wafer in a portion that does not extend into the optical region.

As shown in FIG. 3B, the series of acts 301 further includes an act 315 of disposing electronic component(s) on the PIC wafer, the electronic component(s) including electrical transmitter and receiver portions interconnected with the optical transmitter and receiver portions and forming electro-optical paths to and from the electronic component (s) to the optical region. In one or more embodiments, the act 315 includes disposing one or more electronic components on the PIC wafer, the one or more electronic components including electrical transmitter and receiver portions interconnected with the optical transmitter and receiver portions and forming electro-optical paths to and from the one or more electronic components to the optical region.

As further shown in FIG. 3B, the series of acts 301 includes an act 325 of positioning a sacrificial cap over a top surface of the pic wafer covering the optical region, the sacrificial cap including a recess formed therein positioned over the optical region when the sacrificial cap is placed over the top surface of the wafer. In one or more embodiments, the act 325 includes positioning a sacrificial cap over a top surface of the PIC wafer covering the optical region, wherein the sacrificial cap includes a recess formed therein, and wherein the recess is positioned over a portion of the optical region when the sacrificial cap is placed over the top surface of the PIC wafer.

As further shown in FIG. 3B, the series of acts 301 includes an act 335 of depositing an overmold over the PIC wafer, the electronic component(s), and the sacrificial cap. In one or more embodiments, the act 335 includes depositing an overmold over the PIC wafer, the one or more electronic components, and the sacrificial cap.

As further shown in FIG. 3B, the series of acts 301 includes an act 345 of grinding down a top surface of the overmold where grinding down the top surface of the overmold includes grinding down from a top portion of the sacrificial cap to create an opening at a top of the recess positioned over the portion of the optical region. In one or more embodiments, the act 345 includes grinding down a top surface of the overmold, wherein grinding down the top surface of the overmold includes grinding down from a top portion of the sacrificial cap to create an opening at a top of the recess positioned over the portion of the optical region.

In one or more embodiments, the series of acts 301 includes coupling the one or more fibers to the waveguides formed within the PIC wafer via the one or more structures on the side surface of the PIC wafer. In one or more embodiments, the one or more side structures are one or more v-grooves formed within the side surface of the PIC wafer. In one or more embodiments, the waveguides couple components of the electro-photonic circuit with one or more additional components off-chip from the electro-photonic circuit.

In one or more embodiments, the series of acts 301 includes an act of, prior to depositing the overmold over the top surface of the PIC wafer, disposing one or more electronic components on the top surface of the PIC wafer, where disposing the one or more electronic components over the top surface of the PIC wafer comprises connecting electrical contacts on the one or more electronic components to bumps on the top surface of the PIC wafer and forming electro-optical paths to and from the one or more electronic components to the optical region via waveguides formed within the PIC wafer. In one or more embodiments, the one or more electronic components include one or more of a processor component, a memory component, or an analog mixed signal (AMS) block.

In one or more embodiments, prior to grinding down the top surface of the overmold, the top portion of the sacrificial cap extends over a top of the recess and the top portion of the sacrificial cap has a thickness of greater than 25 microns. In one or more embodiments, a thickness between a top and bottom surface of the sacrificial cap prior to grinding down the top surface of the overmold is less than 1000 microns.

In one or more embodiments, the overmold does not flow between the sacrificial cap and the PIC wafer. In one or more embodiments, the sacrificial cap is made from a same material as a material of the overmold that is deposited over the PIC wafer. In one or more embodiments, the sacrificial cap is made from a different material as a material of the overmold that is deposited over the PIC wafer.

In one or more embodiments, the PIC wafer includes a first package portion and a second package portion adjacent to the first package portion, the first package portion having the one or more electronic components deposited thereon, the edge region being formed in a region between the first package portion and the second package portion. In one or more embodiments, the series of acts 301 includes an act of dicing vertically between a top surface and a bottom surface of the PIC wafer and through a portion of the recess, where dicing vertically between the top surface and the bottom surface of the PIC wafer through the portion of the recess provides lateral access to the side surface of the PIC wafer having the edge coupling component formed therein. In one or more embodiments, the series of acts 301 includes coupling the one or more fibers to the waveguides via the laterally accessible side surface, where coupling the one or more fibers to the waveguides causes the one or more fibers to be optically coupled to the one or more electronic components via the waveguides formed within the PIC wafer.

In one or more embodiments, the side surface is formed within an interior side surface formed within an outer perimeter of the PIC wafer. In one or more embodiments, the side surface is formed within an exterior side surface formed around the outer perimeter of the PIC wafer.

Additional details are now provided regarding circuit packages, including electro-photonic circuit packages. In particular, FIGS. 4A-4B, FIG. 5, and FIG. 6A-6D provide additional details regarding wafers, circuit packages, bidirectional photonic paths, and optical connections via an FAU.

As used herein, the term "photonic" refers to the use of light and/or photons for various applications. For instance, a "photonic path," "photonic channel," "photonic element," "photonic signal," and other similar uses operate based on the transmission of electromagnetic radiation as photons. For instance, in some cases photonic refers to the transmission, manipulation, and/or use of light, such as light in the visible spectrum, or from about 400 to about 700 nm. In some cases, photonic refers specifically to laser light. For example, in some cases photonic may include light or electromagnetic radiation in one or more of the ultraviolet spectrum (100 to 400 nm), the visible light spectrum (400 to 700 nm), or the infrared spectrum (700 nm to 1 mm). For example, in some cases herein, photons may be transmitted via a laser light source operating in any of these (or a smaller range) of wavelengths. In some cases, the term "optical" is used interchangeably herein to mean photonic.

Accordingly, a photonic path or photonic channel refers to the trajectory that photons (e.g., particles of light) follow through a medium or a device designed to guide or manipulate light. A photonic path can include waveguides, fibers, free space transmission paths, and other elements that provide precise control over photon behavior. In some instances, a photonic path includes a photonic elements which route light through a medium. In various implementations, a photonic path corresponds to both macroscopic (classical optics) and microscopic (quantum optics) manipulations of photons.

Figure 4A:
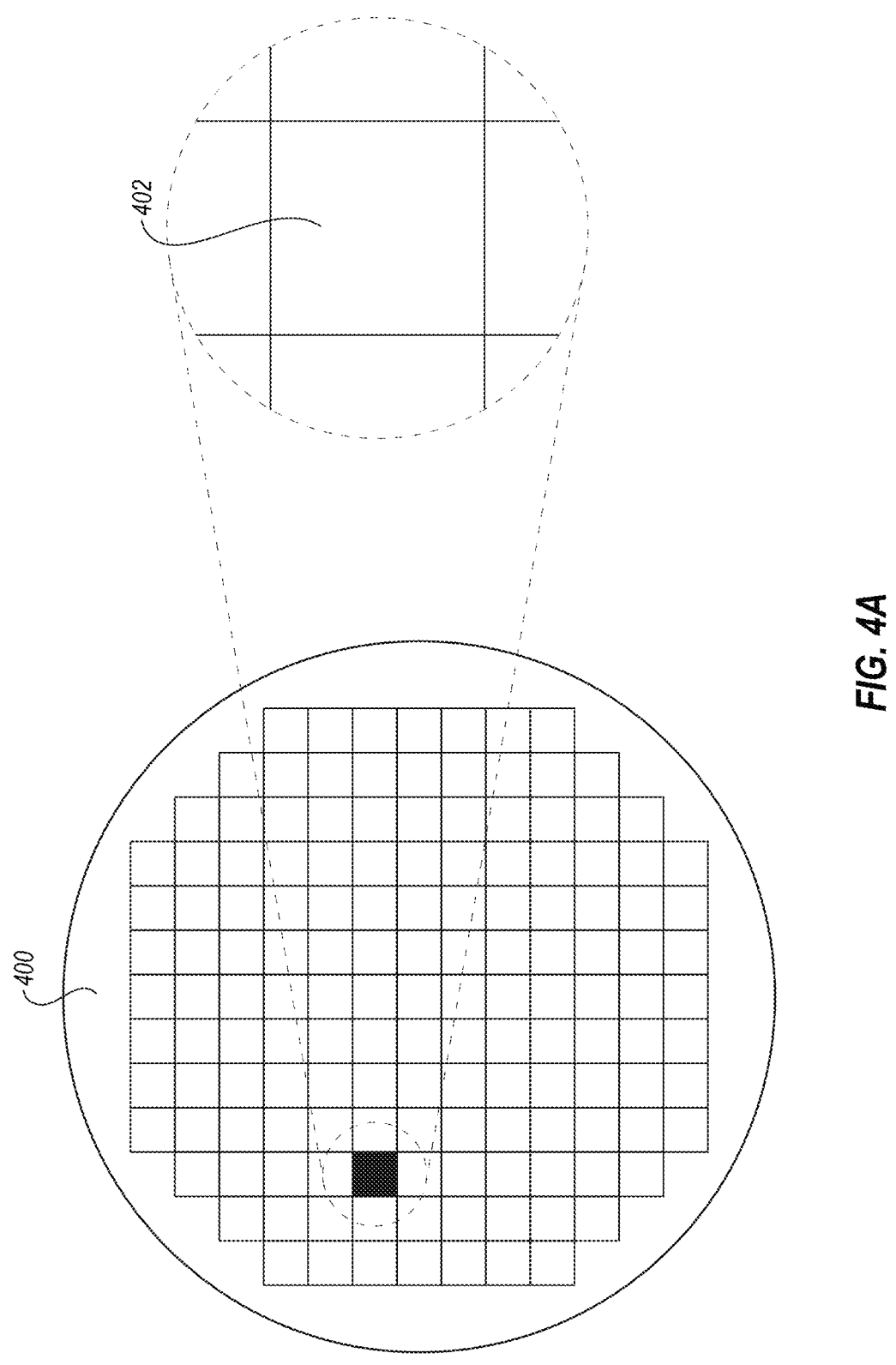
FIG. 4A illustrates a top view of a wafer and a die, which may be included in one or more circuit packages, according to at least one embodiment of the present disclosure.

In various implementations, various components of a circuit package may be created using wafers. For example, FIG. 4A corresponds to using wafers to create circuit package components according to some implementations. To illustrate, FIG. 4A shows a top view of a wafer 400 and a die 402, which may be included in one or more circuit packages (e.g., microelectronic packages).

In some instances, the wafer 400 is composed of semiconductor material and includes one or more dies having integrated circuit (IC) structures formed on the surface of the wafer 400. As shown, the wafer 400 may comprise multiple (and often many) dies, which may be copies or iterations of the same IC, or may be ICs of different variations. Each of the dies may be a unit of a semiconductor product or other hardware that includes a suitable IC. After the fabrication of the semiconductor product is complete, the wafer 400 may undergo a singulation process in which the dies are separated from one another to provide discrete "chips" of the semiconductor product. The die 402, and at least one other die, may be included in a microelectronic package with a PIC. Accordingly, a die as used herein may refer to a section or portion of a larger wafer structure having an IC formed thereon or may refer to that section or portion having been diced or cut from the wafer as a discrete chip.

A PIC can be formed in a second process using a second wafer (not shown) in a manner analogous to the fabrication of the die 402. While the die 402 may be used to fabricate electronic elements, such as EIC components, a PIC may be fabricated with optical components. In some implementations, the PIC can be embedded into a package substrate. The package substrate may be considered a cored or coreless substrate and may include one or more layers of dielectric material, which may be organic or inorganic.

The package substrate may further include one or more conductive elements, such as vias, pads, traces, microstrips, strip lines, etc. The conductive elements may be internal to, or on the surface of, the package substrate. Generally, the conductive elements may allow for the routing of signals through the package substrate or between elements coupled to the package substrate. In some implementations, the package substrate may be a printed circuit board (PCB), an interposer (e.g., an organic interposer), a motherboard, or other types of substrate.

In one or more implementations, the wafer 400 or the die 402 may include a memory device, a computing device, a storage device, or a combination thereof (examples include, but are not limited to, a random-access memory (RAM) device (such as a static RAM (SRAM) device, a magnetic RAM (MRAM) device, a resistive RAM (RRAM) device, or a conductive-bridging RAM (CBRAM) device), a logic device (e.g., an AND, OR, NAND, NOR, or EXOR gate), a NANO flash memory, a solid-state drive (SSD) memory, a NOR flash memory, a CMOS memory, a thin-film transistor-based memory, a phase-change memory (PCM), a storage class memory (SCM), a magneto-resistive memory (MRAM), a resistive RAM, a DRAM, a high bandwidth memory (HBM), a DOR-based DRAM, a DIMM memory, a CPU, a GPU, an MPU, a tensor engine, a load/store unit (LDSU), a neural compute engine, a dot-product and/or convolution engine, a field-programmable gate array (FPGA), an artificial intelligence (AI) accelerator, or any other suitable circuit element.

Multiple instances of these devices may be combined on a single die. For example, the die 402 may include a memory comprising multiple memory arrays, one or more processors, other logic, communication circuits, and power management functions. The die may operate to execute instructions stored in the memory array or otherwise interact with the memory array using the processors on die 402.

Figure 4B:
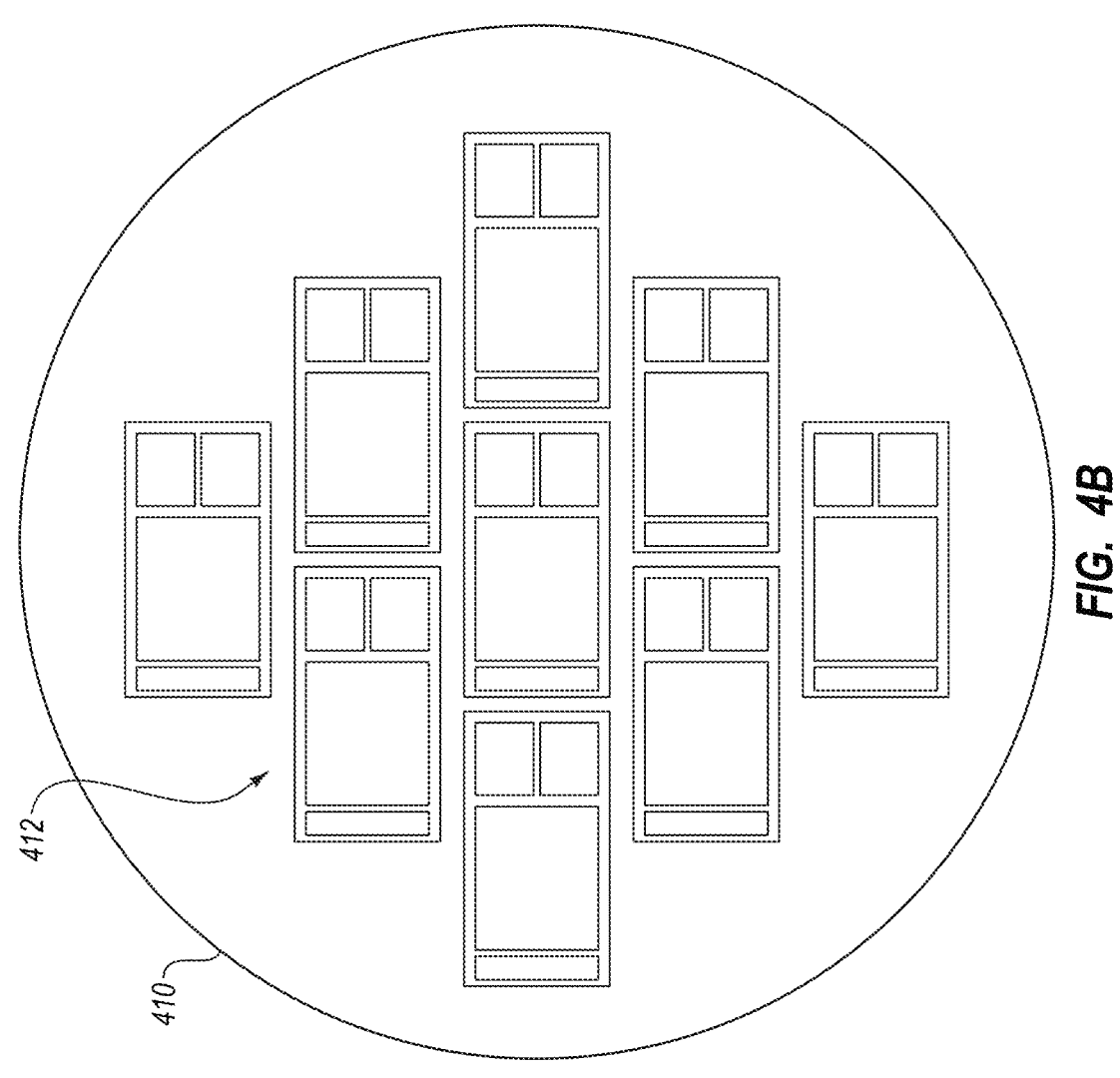
FIG. 4B illustrates a top view of a wafer having various components disposed thereon, according to at least one embodiment of the present disclosure.

As an additional example of using wafers, FIG. 4B corresponds to components formed on wafers, including one or more circuit packages according to some implementations. To illustrate, FIG. 4B shows a top view of a wafer 410 having various components disposed thereon. For example, one or more circuit packages 412 (e.g., electro-photonic circuit packages) may be formed from various electronic components disposed on a corresponding portion of the wafer 410.

In some cases, the wafer 410 may be composed of a substrate material such as silicon or another substrate material. The substrate may include one or more layers of a dielectric material, which may be organic or inorganic. The wafer 410 may be a PIC wafer having photonic components and/or an EIC wafer having electronic components. In various implementations, the wafer 410 provides various photonic interfaces, channels, photonic components, and other photonic features which, in connection with corresponding electronic components, may form one or more circuit packages 412.

Similar to the above description, the wafer 410 may further include one or more conductive elements, such as vertical interconnect accesses (vias), pads, traces, microstrips, strip lines, etc. The conductive elements may be internal to, or on the surface of, the wafer 410. Generally, the conductive elements may allow for the routing of signals (e.g., power and/or communication signals) through the wafer 410 or between elements coupled to the wafer 410. In some implementations, the wafer 410 may be a PCB, PIC substrate, an interposer (e.g., organic interposer), a motherboard, or another type of substrate.

As mentioned, the one or more circuit packages 412, including electro-photonic circuit packages, may be formed from various electronic components disposed on the wafer 410. In some cases, the electronic components are coupled to photonic components in the wafer 410. In various implementations, the one or more circuit packages 412 include a memory device, a computing device, a storage device, or a combination thereof.

Multiple instances of these examples may be combined in a circuit package. For example, a circuit package may include a memory comprising multiple memory arrays, one or more processors, other logic, communication circuits, and power management functions. Furthermore, the circuit package may execute instructions stored in the memory array or otherwise interact with the memory array using the processors on the one or more circuit packages 412.

In some cases, a single wafer may be advantageously manufactured and utilized for producing several circuit packages. For example, after the fabrication and/or assembly of the circuit packages is complete, the wafer 410 may undergo a singulation (e.g., dicing) process in which individual circuit packages are separated from one another to provide discrete "chips," as mentioned above. An electro-photonic circuit package may include any of the features and/or functionalities according to any of the circuit packages described in this document.

In some cases, each of the one or more circuit packages 412 of the wafer 410 is the same. In various implementations, one or more of the one or more circuit packages 412 (e.g., electro-photonic circuit packages) are configured differently.

In one or more implementations, the wafer 410 may be implemented in connection with various processing equipment by positioning, supporting, and/or securing the wafer 410 with respect to the processing equipment. In some cases, the processing equipment may manipulate, process, or otherwise operate on the wafer 410 as part of forming the one or more circuit packages 412, such as to form one or more TSVs at least partially through the wafer 410, to dispose, position, and/or bond dies to the wafer 410, to form overmolding on the wafer 410, or other processes.

Figure 5:
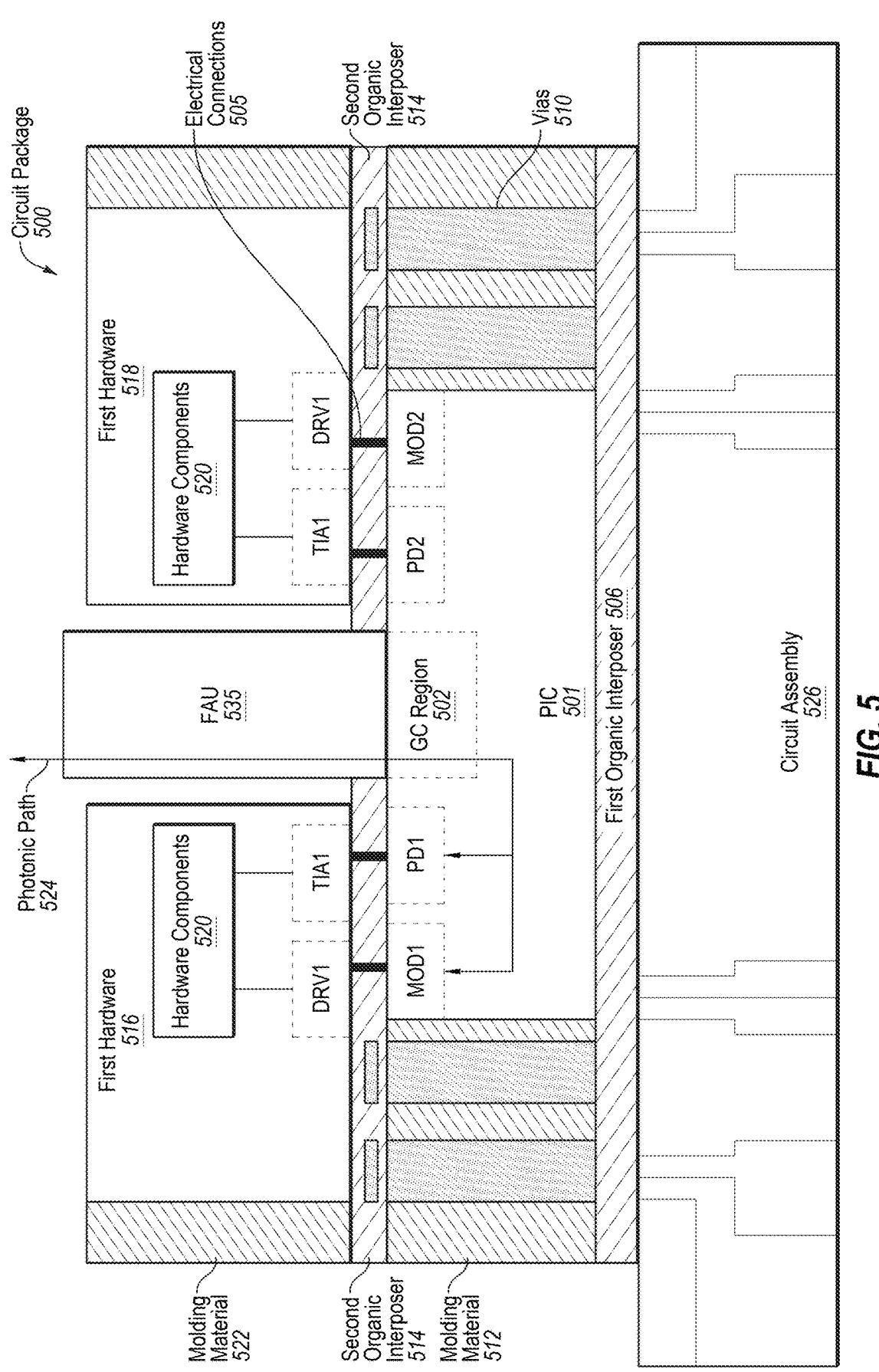
FIG. 5 illustrates an example side-view cross-section diagram of a circuit package that includes various compo-nents and that is coupled to a fiber array unit, according to at least one embodiment of the present disclosure.

As mentioned above, circuit packages can include various components and connections. To illustrate, FIG. 5 shows an example side-view cross-section diagram of a circuit package that includes various components and that is coupled to a fiber array unit. In particular, FIG. 5 illustrates an example circuit package having various PIC components and EIC components according to some implementations. While FIG. 5 provides one example implementation of a circuit package that may be used in connection with a PIC and other circuit packages described in this document, FIG. 5 is not intended to limit all circuit packages.

As shown, FIG. 5 includes a circuit package 500 with a PIC 501, a first hardware 516 (e.g., a first die), and a second hardware 518 (e.g., a second die), each having one or more hardware components 520 and/or hardware elements. As shown, the PIC 501 includes a GC region 502 that allows photonic (e.g., optical or light) signals to enter and exit the PIC 501. In many implementations, the GC region 502 is coupled to an FAU 535, which sits between an internal cavity area within a second organic interposer 514.

As shown in FIG. 5, the PIC 501 is positioned over a first organic interposer 506. The first organic interposer 506 may be a redistribution layer (RDL) that provides any number of connection structures (e.g., interconnects or connection elements) through which components of the circuit package 500 and a circuit assembly 526 (e.g., a substrate) may communicate. For example, in some instances, the circuit assembly 526 is coupled to electrical or electro-photonic components that enable electrical communications to pass between the circuit package 500 and other components that are electrically coupled to the circuit assembly 526.

The first organic interposer 506 (and organic interposer layers such as the second organic interposer 514) may refer to a layer having a variety of thicknesses and which includes one or more input/output (I/O) pads (electrical connection elements) that provide connectivity for electrical elements of the circuit package to communicate electronically with other elements of the circuit package. The organic interposer layers (e.g., the first organic interposer 506 and the second organic interposer 514) may include wiring, interconnects, and other components that enable components of the circuit package 500 to be electrically coupled to components of one or more additional electronic packages.

In various implementations, the circuit package 500 provides optically accessible co-packaged optics to connect one or more external packages to the PIC 501. Indeed, the GC region 502 couples to the FAU 535 (or another optical interface) such that some or all of a bidirectional photonic path within the circuit package 500 photonically communicates with a light engine or another external device. In turn, the bidirectional photonic path allows these external components to communicate with the hardware components (e.g., the first hardware 516 and the second hardware 518) of the circuit package 500 via a photonic path 524.

The circuit package 500 also includes vias 510 (e.g., conductive through vias such as through-silicon vias (TSVs), through-chip vias, or through-substrate vias). The vias 510 may be manufactured in any known way so electrical signals (such as power and control signals) can travel between the organic interposers. The vias 510 provide interconnectivity between different layers of an electrical system within the circuit package 500. In addition, it will be understood that while FIG. 5 illustrates four of the vias 510, the circuit package 500 may include any number of the vias 510 in various configurations. Further, while FIG. 5 illustrates a side view showing a single row of vias 510, additional vias may be manufactured toward additional axes (e.g., y-axis, z-axis) relative to the side view shown.

In some implementations, the vias 510 are formed by etching, removing, or otherwise forming a channel void, conduit, or passage, then depositing one or more conductive layers in the channel. In some cases, the vias may pass entirely from a top surface to the bottom surface of a substrate or material (e.g., an organic interposer). In some cases, the vias may connect to one or more conductive layers, such as to one or more organic interposers. In this way, the vias 510 may facilitate connecting one or more components positioned on opposite surfaces of an organic interposer, such as connecting EIC components in a hardware or die to corresponding components in a PIC opposite the organic interposer. Additionally, vias may facilitate providing power transmission to various hardware components of the electrical dies by transmitting the power from or through the bottom surface of the circuit package 500.

As further shown in FIG. 5, the circuit package 500 includes molding materials 512, 522 deposited as part of the process of manufacturing the circuit package 500. The molding materials 512, 522 may be made from a variety of materials having various properties. For example, in one or more implementations, the molding materials 512, 522 are epoxy molding compounds in a liquid form that secure elements of the circuit package 500 in place and cover certain elements contained within the structure of the circuit package 500.

As shown in FIG. 5, the circuit package 500 includes a second organic interposer 514. As mentioned above, the second organic interposer 514 may be an RDL that provides any number of connection structures (e.g., interconnects) through which components of the circuit package 500 may communicate. For example, the second organic interposer 514 includes connective elements and/or interconnects between the vias 510 and the hardware components (e.g., the first hardware 516 and the second hardware 518) within the electronic portion (e.g., the electrical layer) of the circuit package 500. The second organic interposer 514 also includes electrical connections 505 (e.g., electrical intercon-nects or interconnections, such as copper pillars or wires) between the hardware components and the photonic com-ponents (e.g., MOD1, MOD2, PD1, and PD2) in the PIC 501.

As further shown in FIG. 5, the circuit package 500 includes connected hardware components (e.g., dies having EIC components) attached above the second organic inter-poser 514. In some implementations, the hardware compo-nents may include analog-mixed signal (AMS) blocks with components for facilitating the transmission of signals between an electronic domain and a photonic domain. For instance, the AMS blocks include photonic modulator driv-ers (DRV1, DRV2) for controlling associated photonic modulators (MOD1, MOD2). The modulators (MOD1, MOD2) receive photonic carrier signals and encode data into the carrier signals to transmit, via waveguides (e.g., a portion of the photonic path 524 located on the PIC 501), encoded or modulated photonic signals.

In various implementations, the AMS blocks also include transimpedance amplifiers (TIA1, TIA2) for receiving, through a connection to associated photo detectors (PD1, PD2), encoded photonic signals via one or more wave-guides. In various implementations, the AMS blocks com-municate with electrical hardware blocks (e.g., hardware components), which may refer to a variety of hardware blocks or dies, including EIC die(s) and/or application-specific integrated circuit (ASIC) die(s) having one or more of the components described in this document.

The electronic components of the electrical dies, such as the drivers (DRV1, DRV2) and the TIAs (TIA1, TIA2), may be connected to the corresponding photonic components in the PIC 501, such as MODs (MOD1, MOD2) and PDs (MOD1, MOD2), through electrical connections 505 (e.g., electrical interconnects). For example, the electrical connec-tions 505 may be solder bumps, copper pillars, microbumps, or other interconnects for facilitating a connection of com-ponents at the surface of a wafer.

The electrical connections 505 may be printed, deposited, or otherwise positioned on a wafer in accordance with the topography, architecture, or layout of the photonic compo-nents in the PIC 501. For instance, the electrical connections 505 may be positioned on the surface of a wafer and may form a map or guide for orienting the positioning of the electrical dies (e.g., the first hardware 516 and the second hardware 518) on a wafer. In this way, disposing, position-ing, bonding, or connecting components of EIC components with each electrical hardware to the wafer may include precisely aligning the EIC components with corresponding electrical connections to form electrical connections.

As mentioned above, in various implementations, the circuit package 500 is an electro-photonic circuit package that performs one or more computing, memory, or other functionalities and may communicate (e.g., transmit and/or receive) data via photonic signals. Indeed, the circuit pack-age 500 may facilitate intra-chip electro-photonic commu-nication as well as inter-chip electro-photonic communica-tion.

The circuit package 500 includes a first hardware 516 and a second hardware 518, which may include one or more hardware components 520. The first hardware 516 and the second hardware 518 may have similar or different types of hardware components. For example, the first hardware 516 includes an ASIC chip that has been programmed, custom-ized, or otherwise configured for a particular use. The first hardware 516 may additionally or alternatively include other types of hardware components (e.g., electrical hardware components).

The second hardware 518 may include a similar or different type of hardware components as the first hardware 516. For example, in one or more implementations, the second hardware 518 includes high bandwidth memory (HBM) hardware, a CPU, a GPU, a tensor engine, a neural compute engine, or an AI accelerator. Other implementa-tions may include other types of hardware components. In one or more implementations, one or both of the hardware are electronic hardware components.

While not shown in the illustrated example in FIG. 5, additional components and layers may be manufactured or otherwise added onto the surface of the circuit package 500. For example, one or more additional distribution layers may be added, and additional circuitry or hardware may be connected having a similar configuration as discussed in connection with any examples discussed herein.

As mentioned, the circuit package 500 couples with the FAU 535 or another type of optical interface (O/I), which attaches to the GC region 502 of the PIC 501 of the circuit package 500. The FAU 535 allows for optical fibers to be connected to the circuit package 500. Indeed, the interface block allows for an off-chip bidirectional photonic link to be created between the package hardware and external devices. In some implementations, the FAU 535 couples one or more optical fibers for transmitting photonic signals to and/or from the PIC 501 via the GC region 502.

In some implementations, the FAU 535 and the GC region 502 may facilitate receiving and transmitting (e.g., encoded) photonic signals between the circuit package 500 and other (e.g., off-chip) circuit packages. The GC region 502 of the PIC 501 may be an optical interface that utilizes a photonic path or photonic connection with the FAU 535. For example, the FAU 535 directly mounts or connects to the GC region 502 such that photonic signals are transmitted directly between GCs in the GC region 502 and corresponding optical elements in the FAU 535.

FIGS. 6A-6D illustrate example versions of circuit pack-ages that create a photonic path between a circuit package and one or more circuit packages and/or external devices. Similar to the above description, the packages include a GC region (GC) within a PIC coupled to an FAU (e.g., an optical interface O/I component). In some implementations, the PIC includes a GC region on the bottom surface, which enables the FAU or other optical interface component(s) to couple to the GC region on the bottom of the PIC.

Figure 6A:
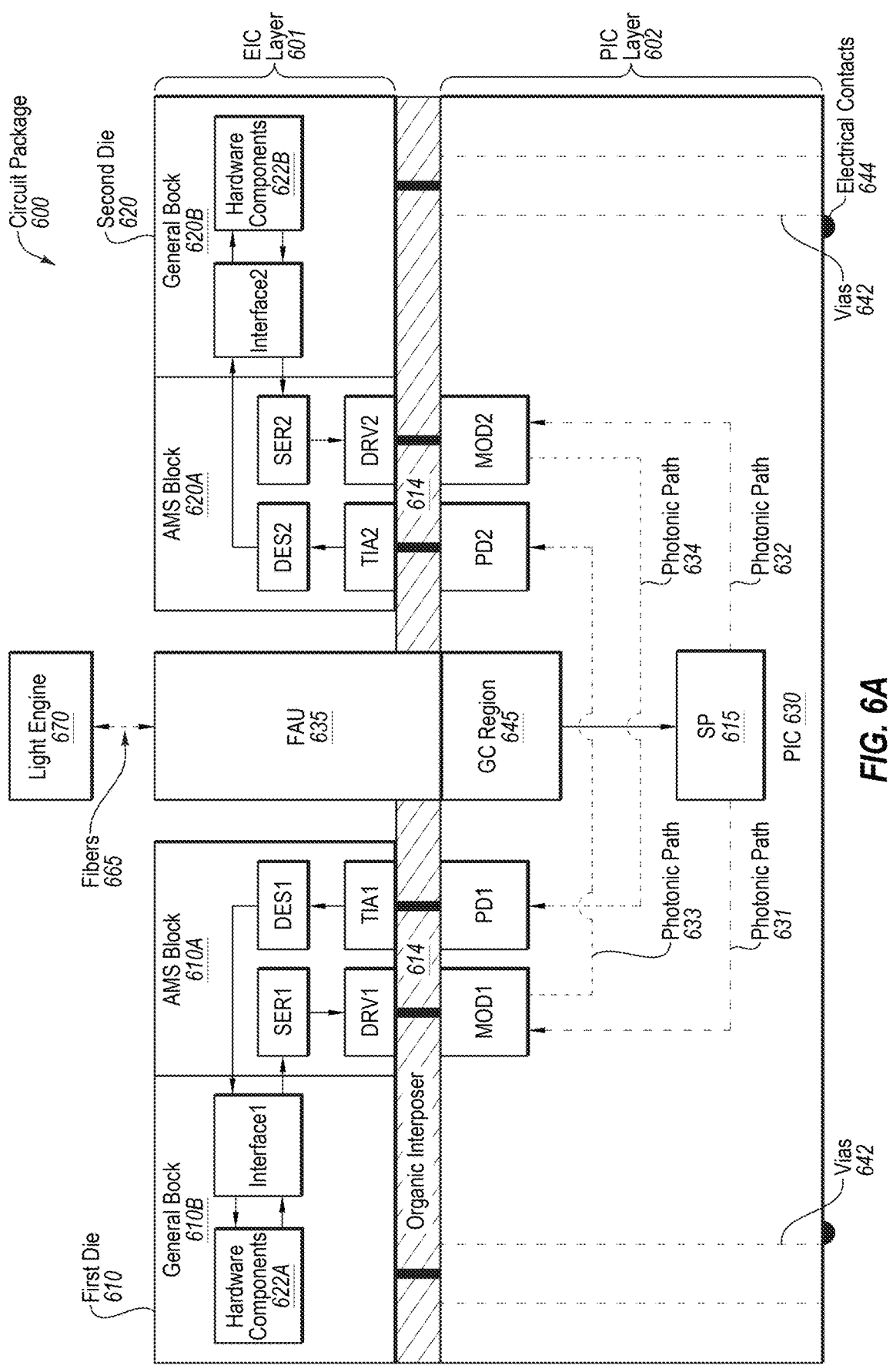
FIGS. 6A-6D illustrate example versions of circuit pack-age that create a photonic path between a circuit package and one or more circuit packages and/or external devices, according to at least one embodiment of the present disclo-sure.

FIG. 6A shows an example package 600 having an EIC layer 601 with a first die 610 and a second die 620 having intra-chip connections therebetween. The circuit package 600 also includes a PIC layer 602 that includes the PIC 630. To illustrate, FIG. 6A shows photonic paths starting at a light engine 670 that pass through the FAU 635 and the GC region 645 to provide light to a PIC 630. Additionally, the package

600 includes a first die 610, divided into a general block 610B that may include various processing, storage, and communication functions and/or components (e.g., Interface1 and hardware components 522A), and an AMS block 610A that includes analog/mixed-signal circuits for interfacing with the PIC 630. The AMS block 610A of the first die 610 may include a driver (DRV1), a transimpedance amplifier (TIA1), a serializer (SER1), and a deserializer (DES1). An AMS block 620A of the second die 620 may include a driver (DRV2), a transimpedance amplifier (TIA2), a serializer (SER1), and a deserializer (DES2). A general block 620B of the second die 620 may include various processing, storage, and communication functions and/or components (e.g., Interface 2 and hardware components 522B). In some instances, the package includes molding material surrounding the PIC 630 (e.g., an optical substrate).

As shown in FIG. 6A, the light engine 670 (e.g., laser light source) transmits light via fibers 660 to the FAU 635 and from the FAU 635 inside the PIC 630 via the GC region 645. In some instances, the GC region and the FAU is located on the bottom of the PIC, as described above. Once inside the PIC 630, the light travels to a splitter 615 (SP) that distributes the light over two different photonic paths 631 and 632 towards modulator MOD1 and modulator MOD2. Example modulator types include a Mach-Zehnder interferometer (MZI), ring resonator, electro-optic modulator (EOM), acousto-optic modulator (AOM), liquid crystal modulator (LCM), and digital micromirror device (DMD).

In one or more implementations, the splitter 615, or a splitter tree, distributes the light over more than two different photonic paths to additional modulators. A photonic path may be implemented with any suitable optical transmission medium and may include a mixture of waveguides, fibers, and/or free-space optical transmission paths.

Modulator MOD1 modulates the light it receives from the splitter 615 with information from driver DRV1 and transmits the modulated light to photodetector PD2 via photonic path 633. Photodetector PD2 converts the received modulated light into an electrical signal for the second die 620. Driver DRV1 serializer and SER1 in the first die 610, together with transimpedance amplifier TIA2, and a deserializer DES2 in the second die 620, along with modulator MOD1, photonic path 633, and photodetector PD2, these elements form a data channel, or a unidirectional electrophotonic link, from the first die 610 to the second die 620.

Similarly, modulator MOD2 modulates the light it receives from the splitter 615 with information from driver DRV2 and transmits the modulated light to photodetector PD1 via photonic path 634. Photodetector PD1 converts the received modulated light into an electrical signal for the first die 610. Driver 2 and serializer SER2 in the second die 620, together with transimpedance amplifier TIA1 and deserializer DES1 in the first die 610, along with modulator MOD2, photonic path 634, and photodetector PD1, these elements form a data channel, or a unidirectional electro-photonic link, from the second die 620 to the first die 610.

As shown in FIG. 6A, the PIC 630 (e.g., a photonic IC) is attached to an organic interposer 614. The organic interposer 614 may include a bondpad pattern (e.g., an electrical connection element) located over MOD1 and PD1 that matches a bondpad pattern on the first die 610 located under DRV1 and TIA1, or is otherwise configured to form an electrical interconnection between the respective components. The organic interposer 614 may also include a bondpad pattern located over PD2 and MOD2 that matches a bondpad pattern on the second die 620 located under TIA2 and DRV2, or is otherwise configured to form an electrical interconnection between the respective components.

Two or more bondpads of the bondpad pattern on the first die 610 are physically and electrically coupled with two or more bondpads of the bondpad pattern in the organic interposer 614. Similarly, two or more bondpads of the bondpad pattern on the second die 620 are physically and electrically coupled with two or more bondpads of the bondpad pattern in the organic interposer 614.

In one or more implementations, the connective elements (e.g., interconnects) in the organic interposer 614 connect the dies (e.g., the first die 610 and/or the second die 620) to the top surface of the PIC 630. In addition, the interconnects may be implemented using a variety of structures, including copper pillars, solder connections, pads (e.g., bondpads), bump attachments, vias, or any variety of means by which the dies may be coupled to the PIC 630.

In FIG. 6A, an electrical interconnect is shown making a coupling (or abutted coupling) between elements in the AMS blocks of the dies and the corresponding elements in the PIC 630. In one or more implementations, the interconnect is a copper pillar no longer than 2 millimeters. In one or more implementations, the copper pillar can be less than 2 millimeters and, in some instances, less than 400 microns. In other implementations, the electrical interconnects can be solder bumps made of materials such as tin, silver, or copper. If solder bumps are used for the interconnects, then the solder bumps may be flip-chip bumps. In other implementations, the interconnects may be elements of a ball-grid array (BGA), pins of a pin grid array (PGA), elements of a land grid array (LGA), or another type of interconnect. In each of these examples, the interconnects can be less than 2 millimeters and, in some cases, range from 1 to 400 microns.

In general, the interconnects have drivers (DRVs) or transimpedance amplifiers (TIAs) at one end and optical modulators (MODs) or photodetectors (PDs) at the other end. For example, in one or more implementations, the interconnects (e.g., vias such as TSVs) may physically couple with, and allow electrical signals to pass between, electrical elements (e.g., pads) of the dies and and/or the PIC 630. For instance, vias 642 pass through the PIC 630 and electrically couple to electrical contacts 644 at the bottom of the PIC 630 or the circuit package 600.

Additionally, in some instances, an electrical interconnect between a driver and a modulator allows the driver to provide an electrical signal that drives the modulator. In another instance, an interconnect between a transimpedance amplifier (TIA) and a photodetector allows the transimpedance amplifier to receive an electrical signal from the photodetector. In some implementations, the interconnects are such that a driver is stacked directly about a corresponding modulator with no lateral displacement between the two components and/or the two components are substantially in the same vertical column. Likewise, in some implementations, a TIA is stacked directly above a corresponding photodetector with no lateral displacement between the two components and/or the two components are substantially in the same vertical column.

The interconnects in the organic interposer may not have a uniform size, shape, or pitch. A finer pitch of interconnects may be desirable to allow a denser communication pathway between elements coupled to the PIC 630. In one or more implementations, one or more interconnects have minimal lateral displacement. For example, an interconnect is a copper pillar that is straight up and down, perpendicular to the face of a die and the PIC 630 (e.g., between 1-400 microns in length). This allows the electronic transceiver portions in the AMS block (e.g., DRV and TIA) to be directly stacked at one end of the interconnect above its respective photonic transceiver portion in the PIC (EAM and PD) at the other end of the interconnect. In some implementations, the DRV and TIA, as well as the EAM and PD, can be slightly offset from the copper pillar to reduce parasitic effects while still enabling a sub-400-micron gap (interconnect length) between heat-producing elements in the EIC/AMS and passive elements in the PIC 630.

Figure 6B:
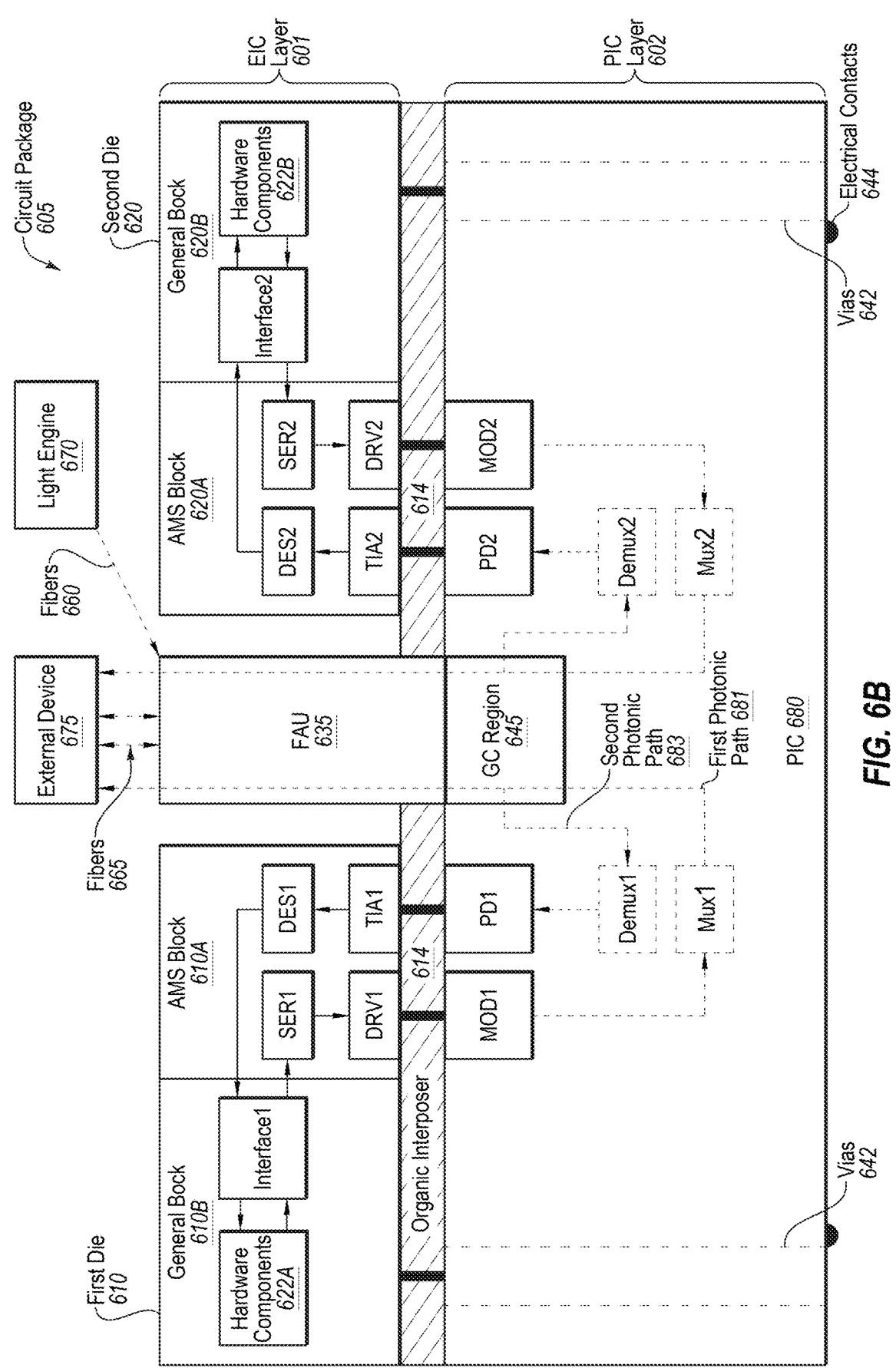

FIG. 6B shows an example of a circuit package 605 that enables an inter-chip or inter-package connection. In particular, FIG. 6B shows a circuit package 605 (e.g., an electro-photonic circuit package) with a photonic path between the circuit package 605 and one or more external devices, which may include another circuit package. Similar to the description above, the circuit package 605 includes the GC region 645 of the PIC 680 connected to an FAU 635. The circuit package 605 includes an internal cavity area in the organic interposer 614 that enables the FAU 635 to couple directly to the GC region 645. Through the FAU 635 and the PIC 680, light signals can enter and exit the circuit package 605. For example, one or more bidirectional photonic paths through the PIC 680 allow dies connected to the PIC 680 to communicate with other external devices.

In FIG. 6B, paths for unmodulated light have been omitted in the PIC 680. Instead, FIG. 6B shows a first die 610 and second die 620 that can photonically communicate with an external device 675 (e.g., an external device optical interface) via fibers 665 (e.g., optical fibers), the FAU 635, and the PIC 680.

The first die 610 may transmit data to the external device 675 via hardware components 522A, Interface 1, SER1, DRV1, MOD1, and a first photonic path 681. As shown, the first photonic path 681 includes an optional multiplexer (MUX1) when wavelength division multiplexing is desired, a first grating coupler in the GC region 645, the FAU 635, and/or the fibers 665. Similarly, the first die 610 may receive data from the external device 675 via a second photonic path 683. The second photonic path 683 includes the fibers 665, the FAU 635, a second grating coupler in the GC region 645, and/or an optional demultiplexer when wavelength division demultiplexing is desired, PD1, TIA1, SER2 and Interface1 (I/F1). The first photonic path 681 and the second photonic path 683 (also referred to as unidirectional electro-photonic links) form a bidirectional data path between two devices on different chips.

While one or more of the above examples refer to specific types of dies, interconnects, substrates, grating couplers, and other specific elements associated with transmitting signals via respective components of the example packages, these are illustrative examples and may utilize different types of components. For example, the two (or more) dies may refer to a variety of hardware or dies and not necessarily the pairing of a general die and an AMS die as described in specific implementations herein. Indeed, the two dies may be similar types of hardware and may refer to computing hardware, processing hardware, storage hardware, memory hardware, or other hardware that is implemented on dies and may be coupled to a PIC that optically couples one or more of the dies to an external component in accordance with one or more implementations described herein.

As mentioned above, inter-chip or inter-package connections can include a photonic pathway in both directions (e.g., a bidirectional electro-photonic path), through which data may be communicated between a variety of external components (e.g., another circuit package) that are configured with the external device. In addition, it should be noted that features and functionality of the circuit package may be implemented within a variety of implementations and configurations of packages having different components, setups, and configurations.

Figure 6C:
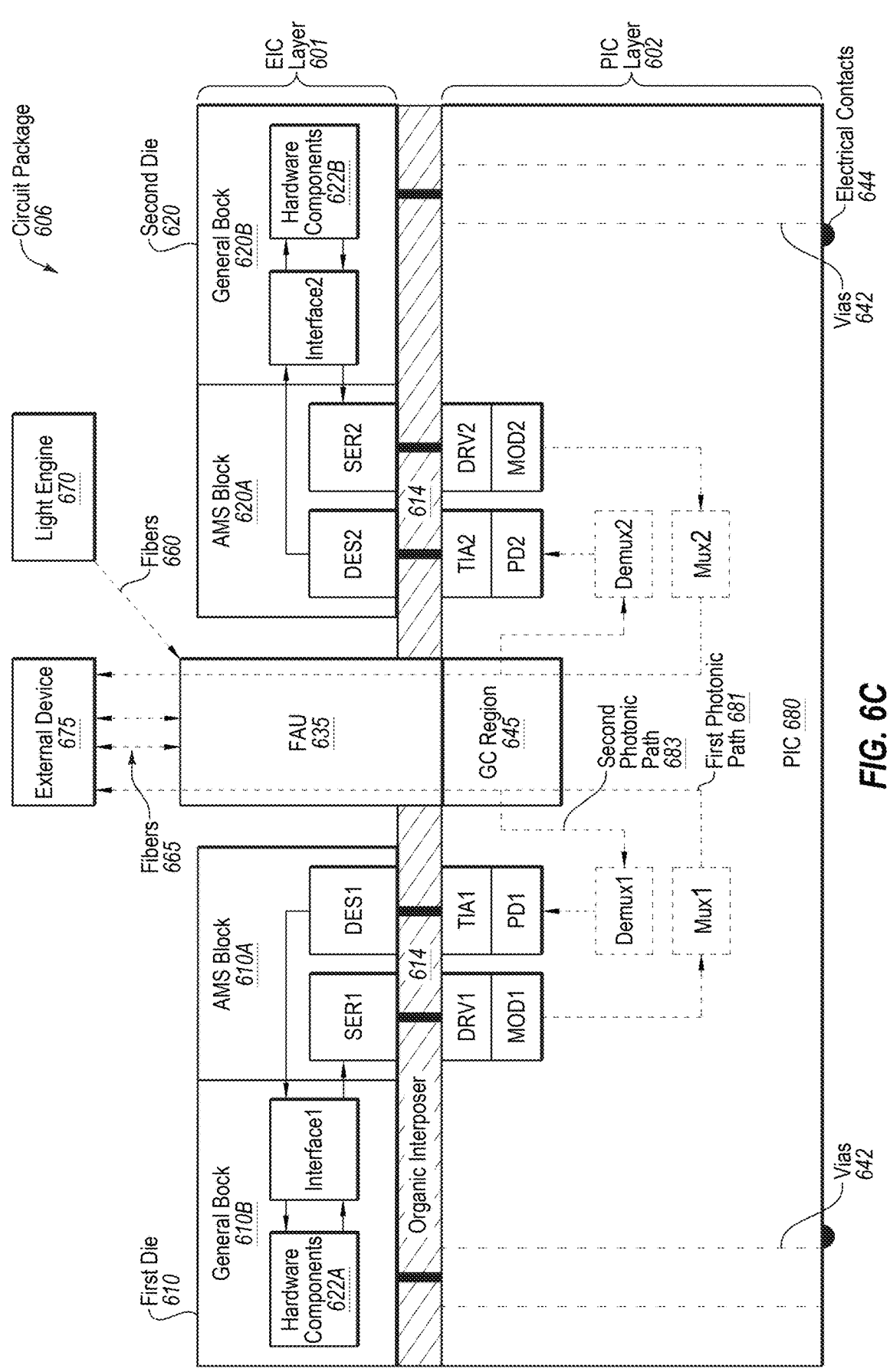

FIG. 6C illustrates another example of the circuit package 606 that enables an inter-chip or inter-package connection. As with the circuit package 605 in FIG. 6B, the circuit package 606 in FIG. 6C can represent an electro-photonic circuit package with a photonic path between the circuit package 606 and one or more external devices, which may include another circuit package.

Differing from the circuit package 605 of FIG. 6B, the circuit package 606 in FIG. 6C shows the drivers and the transimpedance amplifiers, located on the PIC 680 rather than in the dies. In particular, driver DRV1 is connected to modulator MOD1 in the PIC 680, and transimpedance amplifier TIA1 is connected to photodetector PD1 in the PIC 680. Similarly, the circuit package 606 shows that driver DRV2 is connected to modulator MOD2 in the PIC 680, and that transimpedance amplifier TIA2 is connected to photodetector PD2 in the PIC 680.

The drivers (DRV1, DRV2) and modulators (MOD1, MOD2) may be directly connected, connected via an electrical connection, or otherwise electrically connected. Similarly, the transimpedance amplifiers (TIA1, TAI2) and the photodetectors (PD1, PD2) may be directly connected, connected via an electrical connection, or otherwise electrically connected. In various implementations, connecting drivers with modulators and transimpedance amplifiers with photodetectors in close proximity causes the heat from the drivers and transimpedance amplifiers to thermally stabilize the modulators and photodetectors to operate in optimal operational ranges.

Additionally, similar to the circuit package 605 of FIG. 6B, the circuit package 606 in FIG. 6C includes serializers (SER1, SER2) and deserializers (DES1, DES2) in the AMS blocks. However, the serializers and deserializers in the circuit package 606 connect to the drivers and transimpedance amplifiers via the organic interposer 614 rather than within the AMS blocks.

As mentioned, the circuit package 606 includes an organic interposer 614 between the PIC 680 and the dies (e.g., the first die 610 and the second die 620). The organic interposer 614 may include a bondpad pattern (e.g., an electrical connection element) located over DRV1 and TIA1 that matches a bondpad pattern on the first die 610 located under SER1 and SER2, or is otherwise configured to form an electrical interconnection between the respective components. The organic interposer 614 may also include a bondpad pattern located over TIA2 and DRV2 that matches a bondpad pattern on the second die 620 located under DES2 and SER2, or is otherwise configured to form an electrical interconnection between the respective components.

Two or more bondpads of the bondpad pattern on the first die 610 are physically and electrically coupled with two or more bondpads of the bondpad pattern in the organic interposer 614. Similarly, two or more bondpads of the bondpad pattern on the second die 620 are physically and electrically coupled with two or more bondpads of the bondpad pattern in the organic interposer 614.

In one or more implementations, the connective elements (e.g., interconnects) in the organic interposer 614 connect the dies (e.g., the first die 610 and/or the second die 620) to the top surface of the PIC 630. In addition, the interconnects may be implemented using a variety of structures, including copper pillars, solder connections, pads (e.g., bondpads), bump attachments, vias, or any variety of means by which the dies may be coupled to the PIC 630. Other similarities discussed above with the circuit package 605 in FIG. 6B may also apply to the circuit package 606 of FIG. 6C.

Figure 6D:
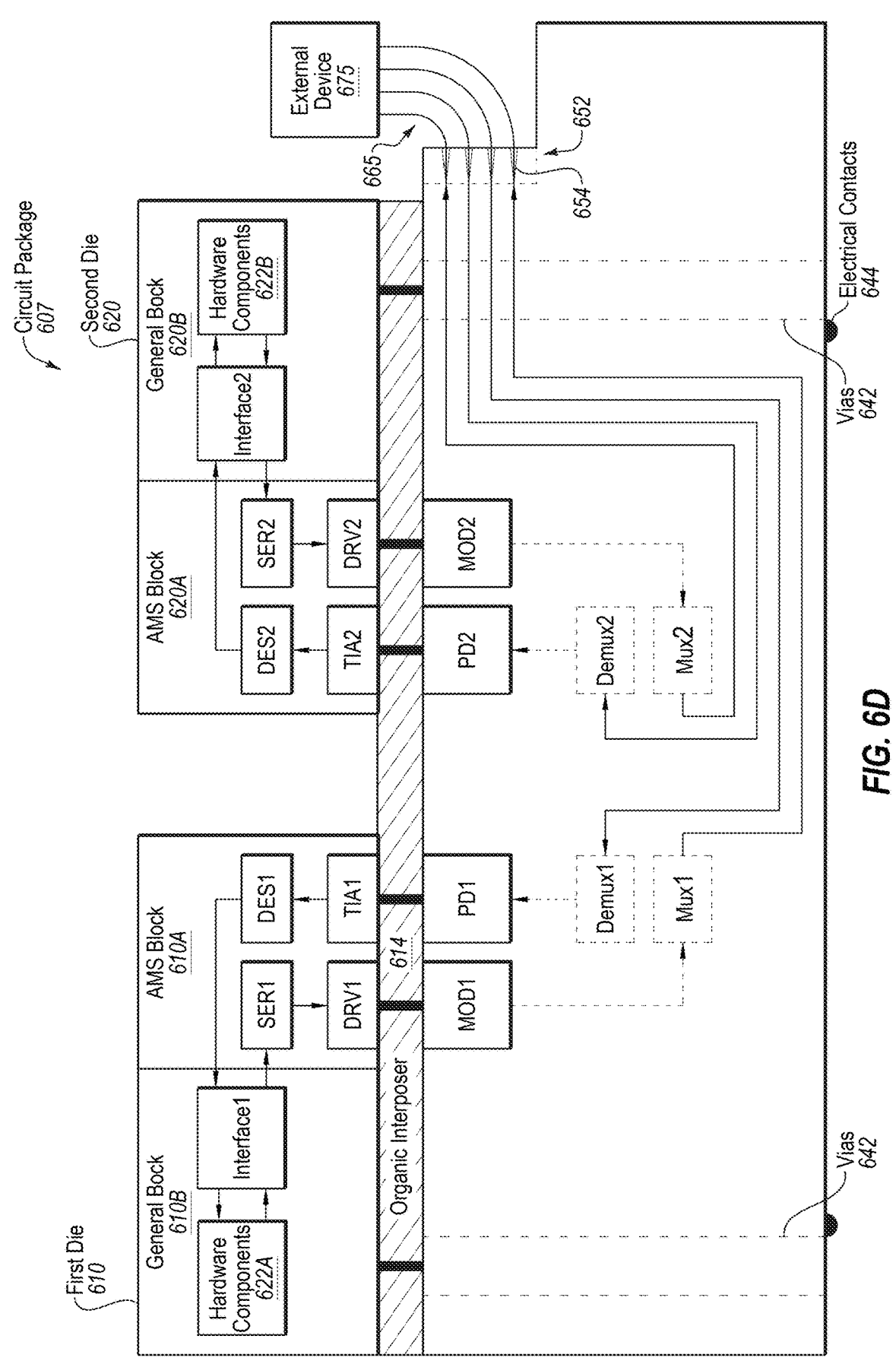

FIG. 6D illustrates another example of the circuit package 607 having inter-chip or inter-package connections via an edge coupler 652, according to embodiments of the present disclosure. The edge coupler 652 may be located at an edge of the PIC 680 and/or PIC layer 602 and may facilitate photonically connecting one or more optical fibers 665 (e.g., horizontally) at the edge of the PIC 680 to photonically connect the circuit package 607 with an external device 675. For example, the edge coupler 652 may be positioned at an edge that is formed in the PIC 680 after the PIC 680 is diced to separate and/or isolate the circuit package 607 as a discrete chip from one or more other circuit packages that may be formed on a larger wafer structure.

The edge coupler 652 may include one or more (typically many) alignment features 653, such as grooves (e.g., V-grooves), slots, cutouts, or other geometries which may receive and/or align the optical fiber(s) 665 such that the optical fiber(s) 665 align with one or more waveguides within the PIC 680. For instance, these alignment features 653 may be structures which are designed with a tapered or mode-matching region, to align modes of the optical fibers 665 and the waveguides at the edge of the PIC 680 thereby reducing insertion loss and enhancing coupling efficiency therebetween. The waveguides may connect to the various photonic components of the PIC 630 in any manner described herein (e.g., including any other photonic components of the PIC 630 as described). In this way, the edge coupler 652 may provide a photonic interface for the photonic components of the PIC 630 to transmit and receive off-chip photonic signals, similar to the GC region 645 as described above.

The edge coupler 652 may be implemented in the circuit package 607 as an alternative to the GC region 645 and FAU 635, or else may be included in addition to these components. For example, in some implementations the GC region 645 and the edge coupler 652 are each photonic interfaces which achieve similar objectives of facilitating photonic communication to and/or from the circuit package 607 with another device, and the circuit package 607 may be implemented with only one type of these photonic interfaces. For instance, in some cases the GC region 645 and FAU 635 may facilitate a vertical or top connection of one or more optical fibers 665, and the edge coupler 652 may facilitate a horizontal or side connection of one or more optical fibers 665. Accordingly, the GC region 645 or else the edge coupler 652 may be particularly suited for a specific implementation, space, and/or packaging requirement of the circuit package 607. In other cases, the circuit package 607 may be implemented with both the GC region 645 and the edge coupler 652, for example, for providing adaptability and connectivity to many different types of devices.

The PIC 680 and the circuit package 607 as described above may be exemplary of any of the wafers, circuit packages, wafer packages, or other connections and/or collections of components as described in any of the embodiments herein. For example, various embodiments herein may be described as having a wafer, PIC, PIC wafer, substrate, dies, EIC, etc., and it should be understood that any of these embodiments (e.g., and others described herein) may be implemented having any of the features, components, or configurations as described in FIGS. 4A-6D. For instance, in cases where an electronic component, die, EIC, chip, etc., is described as being connected to, coupled to, positioned on, disposed on, bonded to, etc., in connection with a PIC or PIC wafer (or the like), it should be understood that such components are positioned with respect to photonic components in the PIC wafer and correspondingly connected to the same via electronic interconnects.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately,"

"about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A circuit package, comprising:
a photonic layer having an optical region near a side surface of the photonic layer and configured to allow one or more fibers to be coupled to waveguides that are formed within the photonic layer, the optical region including edge coupling structures formed within the optical region and being accessible by way of an optical window that provides physical access to the side surface of the photonic layer, the photonic layer further including a first portion of an electro-photonic transceiver optically coupled to the optical region and configured to send and receive light through the optical region in a direction substantially parallel to a top surface of the photonic layer, wherein the edge coupling structures are v-grooves formed within the side surface of the photonic layer;
one or more electronic components having a first plurality of electrical connections on a bottom surface thereof, and being positioned on the top surface of the photonic layer of the package such that there are electrical couplings between the first plurality of electrical connections and a second plurality of electrical connections on the top surface of the photonic layer, the one or more electronic components having a second portion of the electro-photonic transceiver connected to the first portion of the electro-photonic transceiver via the electrical couplings; and
an overmold layer, comprising:
overmold deposited over the photonic layer and the one or more electronic components; and
a sidewall structure adjacent to the overmold on the top surface of the photonic layer positioned above the optical region and not extending over the side surface of the photonic layer.

2. The circuit package of claim 1, wherein the sidewall structure and the overmold are made from different materials.

3. The circuit package of claim 1, wherein the sidewall structure and the overmold are made from a same material.

4. The circuit package of claim 1, wherein the electro-photonic transceiver comprises:
a driver connected to a modulator in the first portion;
a transimpedance amplifier (TIA) connected to a photodiode in the first portion;
a serializer in the second portion that provides an output to the driver; and
a deserializer in the second portion that receives an input from the TIA.

5. The circuit package of claim 4, wherein one or more of the driver and the TIA is in the first portion of the electro-photonic transceiver.

6. The circuit package of claim 4, wherein the modulator is selected from the group consisting of an electro-absorption modulator (EAM), a micro-ring resonator, a ring modulator, a Mach-Zender interferometer (MZI), and a quantum confined stark effect (QCSE) electro-absorptive modulator.

7. The circuit package of claim 5, wherein the first portion is implemented within the photonic layer, and wherein the second portion is implemented within an electrical layer including the one or more electronic components.

8. The circuit package of claim 1, wherein the one or more electronic components include one or more of a processor component, a memory component, or an analog mixed signal (AMS) block.

9. The circuit package of claim 1, wherein the sidewall structure is formed at an edge of an integrated circuit die.

10. The circuit package of claim 1, wherein the sidewall is formed from a sacrificial cap placed over a recess and partially removed from the circuit package.

11. The circuit package of claim 10, wherein the sacrificial cap is partially removed by cutting vertically through the sacrificial cap and the photonic layer and grinding down from a top surface of the overmold.

12. The circuit package of claim 1, wherein the photonic layer is a photonic integrated circuit (PIC) layer.

13. A circuit package, comprising:
a photonic layer having an optical region near a side surface of the photonic layer and configured to allow one or more fibers to be coupled to waveguides that are formed within the photonic layer, the optical region including edge coupling structures formed within the optical region and being accessible by way of an optical window that provides physical access to the side surface of the photonic layer, the photonic layer further including a first portion of an electro-photonic transceiver optically coupled to the optical region and configured to send and receive light through the optical region in a direction substantially parallel to a top surface of the photonic layer;
one or more electronic components having a first plurality of electrical connections on a bottom surface thereof, and being positioned on the top surface of the photonic layer of the package such that there are electrical couplings between the first plurality of electrical connections and a second plurality of electrical connections on the top surface of the photonic layer, the one or more electronic components having a second portion of the electro-photonic transceiver connected to the first portion of the electro-photonic transceiver via the electrical couplings, wherein the electro-photonic transceiver comprises:
a driver connected to a modulator in the first portion,
a transimpedance amplifier (TIA) connected to a photodiode in the first portion,
a serializer in the second portion that provides an output to the driver, and
a deserializer in the second portion that receives an input from the TIA; and
an overmold layer, comprising:
overmold deposited over the photonic layer and the one or more electronic components, and
a sidewall structure adjacent to the overmold on the top surface of the photonic layer positioned above the optical region and not extending over the side surface of the photonic layer.

14. The circuit package of claim 13, wherein one or more of the driver and the TIA is in the first portion of the electro-photonic transceiver.

15. The circuit package of claim 13, wherein the modulator is selected from the group consisting of an electro-absorption modulator (EAM), a micro-ring resonator, a ring modulator, a Mach-Zender interferometer (MZI), and a quantum confined stark effect (QCSE) electro-absorptive modulator.

16. The circuit package of claim 14, wherein the first portion is implemented within the photonic layer, and wherein the second portion is implemented within an electrical layer including the one or more electronic components.

17. The circuit package of claim 13, wherein the one or more electronic components include one or more of a processor component, a memory component, or an analog mixed signal (AMS) block.

18. The circuit package of claim 13, wherein the sidewall structure is formed at an edge of an integrated circuit die.

19. The circuit package of claim 13, wherein the sidewall is formed from a sacrificial cap placed over a recess and partially removed from the circuit package.

20. The circuit package of claim 19, wherein the sacrificial cap is partially removed by cutting vertically through the sacrificial cap and the photonic layer and grinding down from a top surface of the overmold.

21. The circuit package of claim 13, wherein the sidewall structure and the overmold are made from different materials.

22. The circuit package of claim 13, wherein the sidewall structure and the overmold are made from a same material.

23. The circuit package of claim 13, wherein the photonic layer is a photonic integrated circuit (PIC) layer.

* * * * *